(12) United States Patent
Xie et al.

(10) Patent No.: US 12,087,691 B2
(45) Date of Patent: Sep. 10, 2024

(54) SEMICONDUCTOR STRUCTURES WITH BACKSIDE GATE CONTACTS

(71) Applicant: International Business Machines Corporation, Armonk, NY (US)

(72) Inventors: Ruilong Xie, Niskayuna, NY (US);
Julien Frougier, Albany, NY (US);
Veeraraghavan S. Basker, Schenectady, NY (US); Lawrence A. Clevenger, Saratoga Springs, NY (US);
Nicolas Loubet, Guilderland, NY (US);
Dechao Guo, Niskayuna, NY (US);
Kisik Choi, Watervliet, NY (US);
Kangguo Cheng, Schenectady, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 17/480,531

(22) Filed: Sep. 21, 2021

(65) Prior Publication Data

US 2023/0086033 A1   Mar. 23, 2023

(51) Int. Cl.
*H01L 27/088* (2006.01)
*H01L 21/768* (2006.01)
(Continued)

(52) U.S. Cl.
CPC .... *H01L 23/5286* (2013.01); *H01L 21/76895* (2013.01); *H01L 27/0886* (2013.01);
(Continued)

(58) Field of Classification Search
CPC ........... H01L 23/5286; H01L 21/76895; H01L 27/0886; H01L 29/0665; H01L 29/401;
(Continued)

(56) References Cited

U.S. PATENT DOCUMENTS 9,455,254 B2   9/2016   Xie et al.
9,570,573 B1   2/2017   Fan et al.
(Continued)

OTHER PUBLICATIONS

M. Lapedus, "New Transistor Structures at 3nm/2nm," https://semiengineering.com/new-transistor-structures-at-3nm-2nm/, Jan. 25, 2021, 8 pages.
(Continued)

*Primary Examiner* — Niki H Nguyen
(74) *Attorney, Agent, or Firm* — L. Jeffrey Kelly; Ryan, Mason & Lewis, LIP

(57) ABSTRACT

A semiconductor structure comprises a substrate having a first side and a second side opposite the first side, and a gate for at least one transistor device disposed above the first side of the substrate. The structure may further include a buried power rail at least partially disposed in the substrate and a gate tie-down contact connecting the gate to the buried power rail from the second side of the substrate. The structure may further or alternatively include one or more source/drain regions disposed over the first side of the substrate, and a gate contact connecting to a portion of the gate from the second side of the substrate, the portion of the gate being adjacent to at least one of the one or more source/drain regions.

20 Claims, 39 Drawing Sheets

(51) Int. Cl.
*H01L 23/528* (2006.01)
*H01L 29/06* (2006.01)
*H01L 29/40* (2006.01)
*H01L 29/417* (2006.01)
*H01L 29/423* (2006.01)
*H01L 29/786* (2006.01)

(52) U.S. Cl.
CPC ........ *H01L 29/0665* (2013.01); *H01L 29/401* (2013.01); *H01L 29/41775* (2013.01); *H01L 29/42356* (2013.01); *H01L 29/42392* (2013.01); *H01L 29/78696* (2013.01)

(58) Field of Classification Search
CPC ......... H01L 29/41775; H01L 29/42356; H01L 29/42392; H01L 29/78696; H01L 29/0673; H01L 29/66439; H01L 29/66545; H01L 29/775; H01L 27/088; H01L 27/1203; H01L 21/823431; H01L 23/485; H01L 29/0649; H01L 27/1211; H01L 21/823481; H01L 27/0207; H01L 21/84; H01L 29/78; H01L 21/28518; H01L 21/823418; H01L 27/0922; H01L 29/7851; H01L 2027/11881; H01L 21/76802; H01L 2224/11; H01L 23/5228; H01L 27/02; H01L 29/0669; H01L 29/42376; H01L 2027/11829; H01L 21/28525; H01L 21/823412; H01L 27/1207; H01L 29/0692; H01L 29/458; H01L 2924/14
See application file for complete search history.

(56) References Cited

U.S. PATENT DOCUMENTS

| | | | |
|---|---|---|---|
| 9,685,340 | B2 | 6/2017 | Ok et al. |
| 9,978,708 | B2 | 5/2018 | Chen et al. |
| 10,879,375 | B2 | 12/2020 | Fan et al. |
| 2020/0042668 | A1 | 2/2020 | Peng et al. |
| 2020/0373331 | A1* | 11/2020 | Kim .................... H01L 27/1203 |
| 2021/0242322 | A1* | 8/2021 | Liang .................... H01L 29/785 |

OTHER PUBLICATIONS

D. Prasad et al., "Buried Power Rails and Back-side Power Grids: Arm CPU Power Delivery Network Design Beyond 5nm," 2019 IEEE International Electron Devices Meeting, Dec. 2019, 4 pages.
M. Lapedus, "Breaking the 2nm Barrier," https://semiengineering.com/breaking-the-2nm-barrier/, Feb. 18, 2021, 9 pages.
P. Clarke, "Backside of the wafer promises 3D chip improvements: p. 2 of 3," https://www.eenewsanalog.com/news/backside-wafer-promises-3d-chip-improvements/page/0/1, May 20, 2019, 2 pages.

* cited by examiner

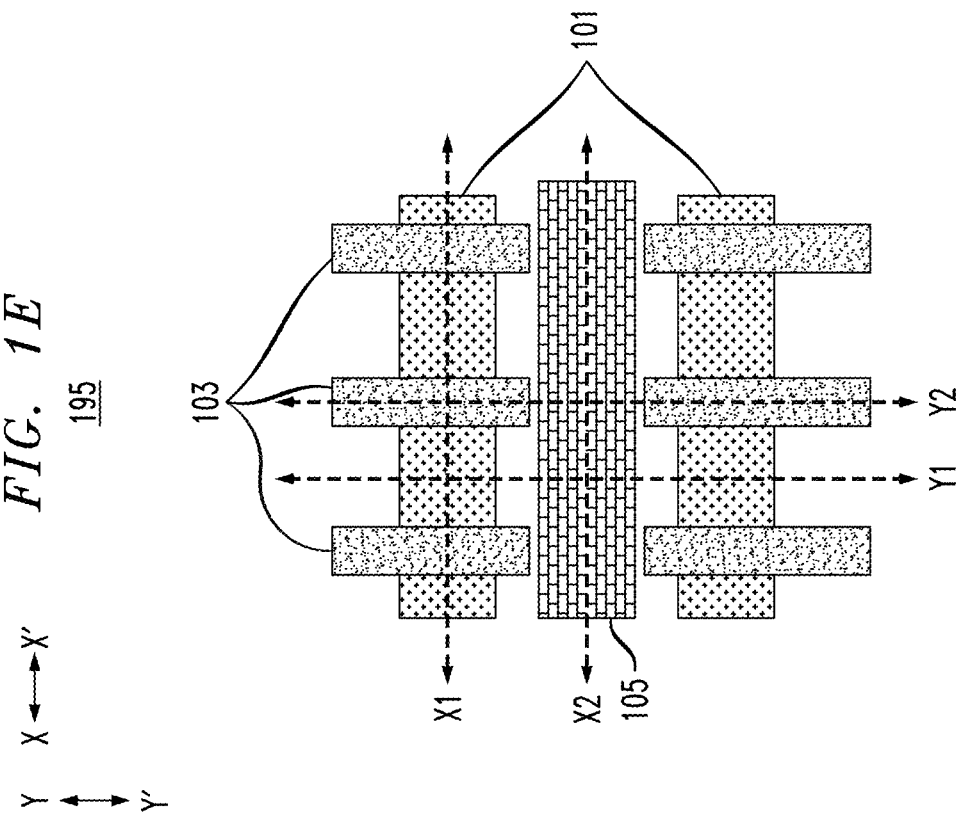

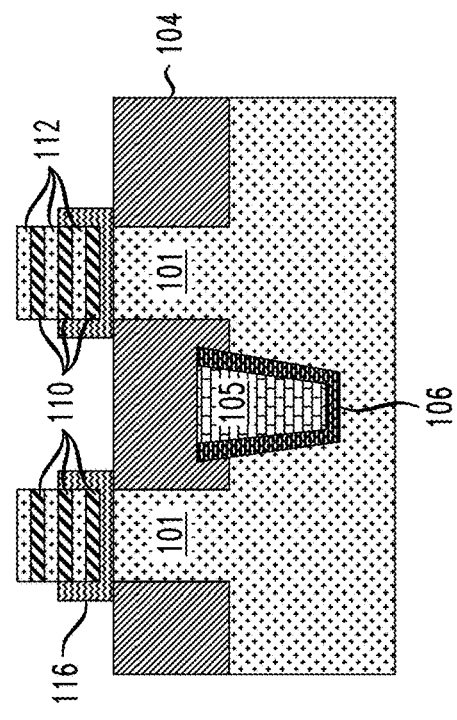
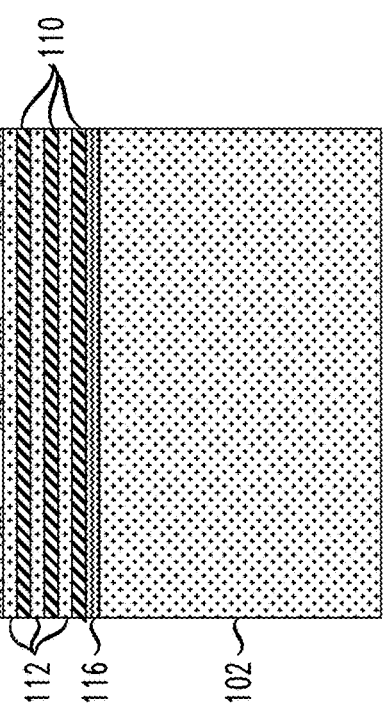
FIG. 2A
FIG. 2B

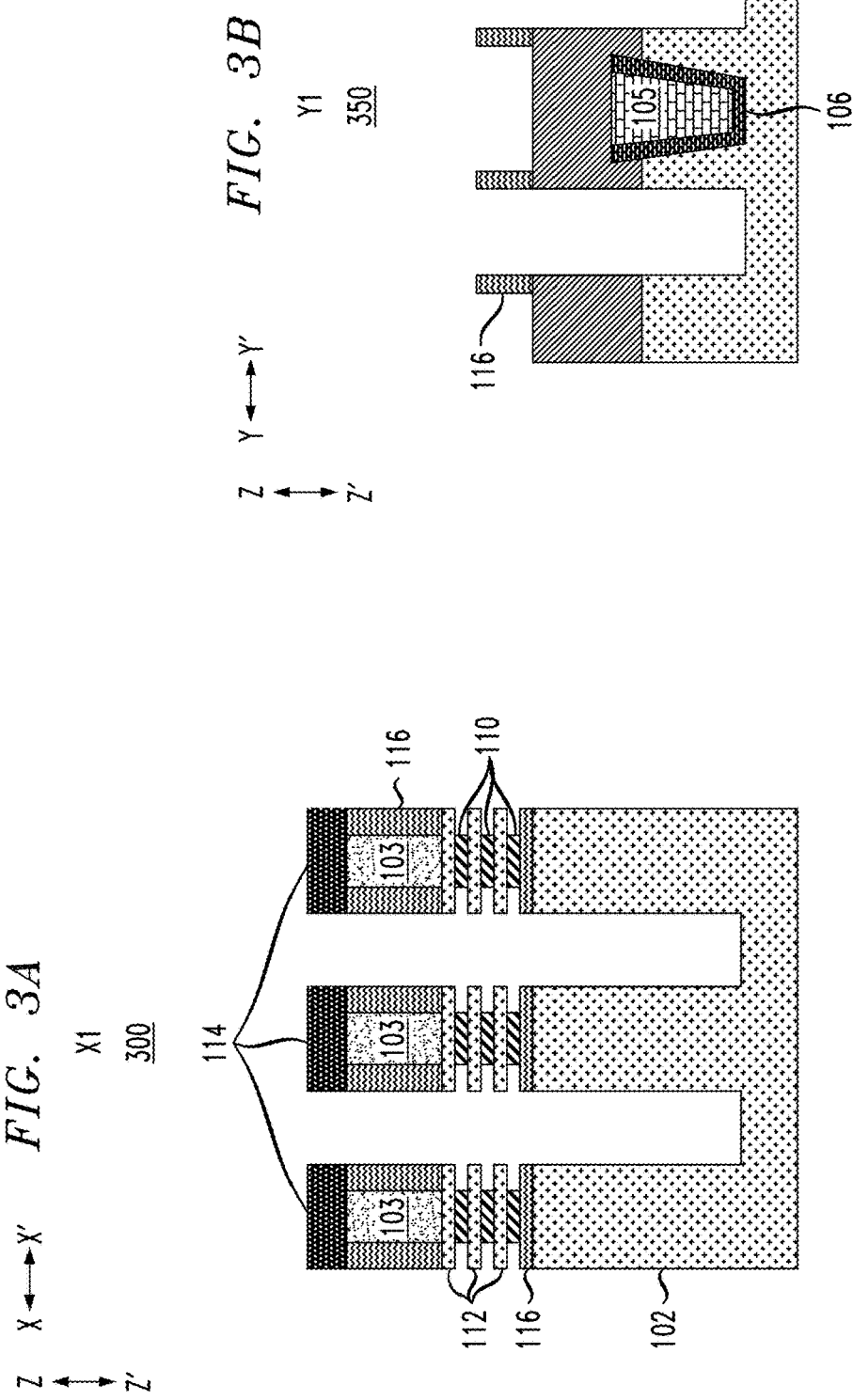

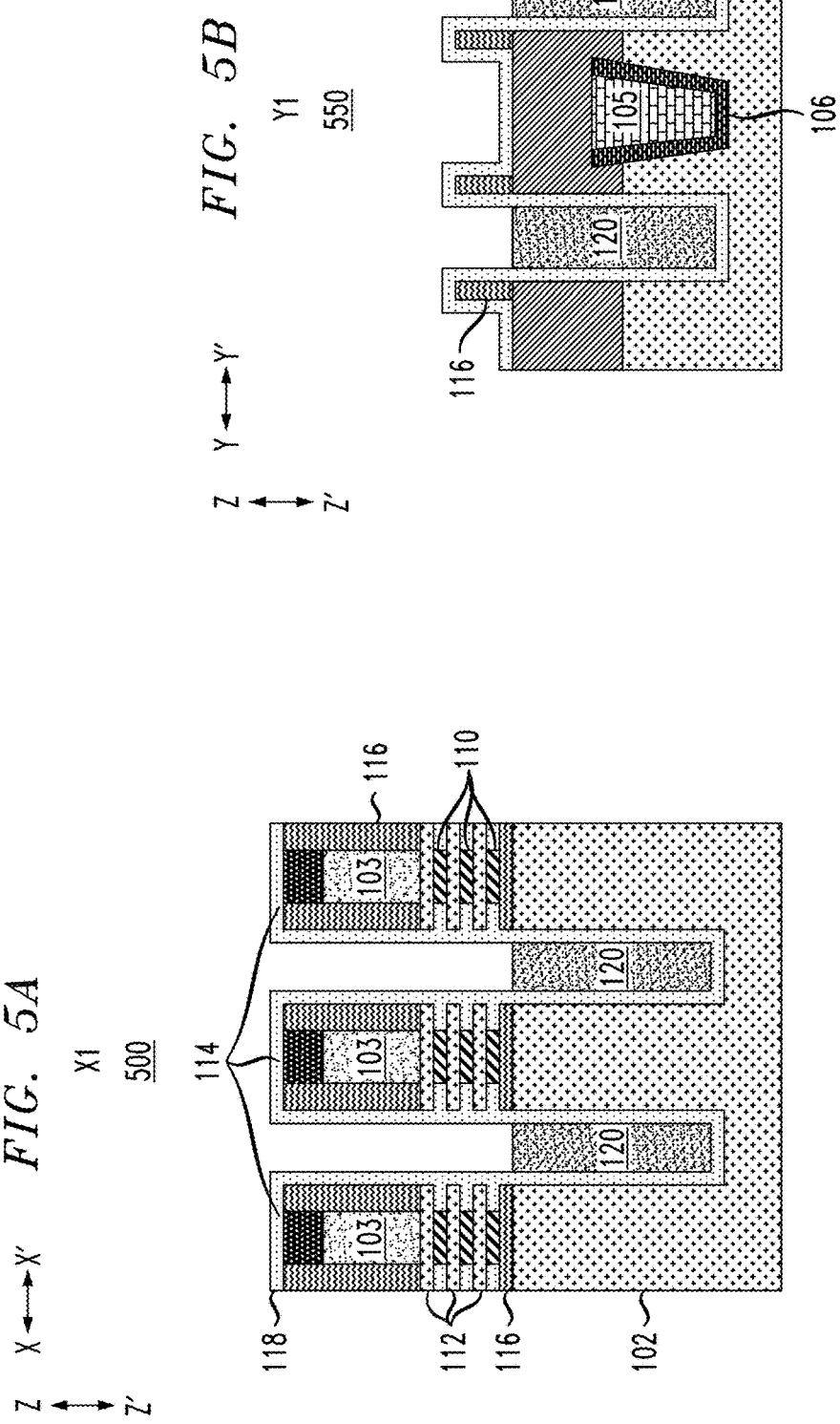

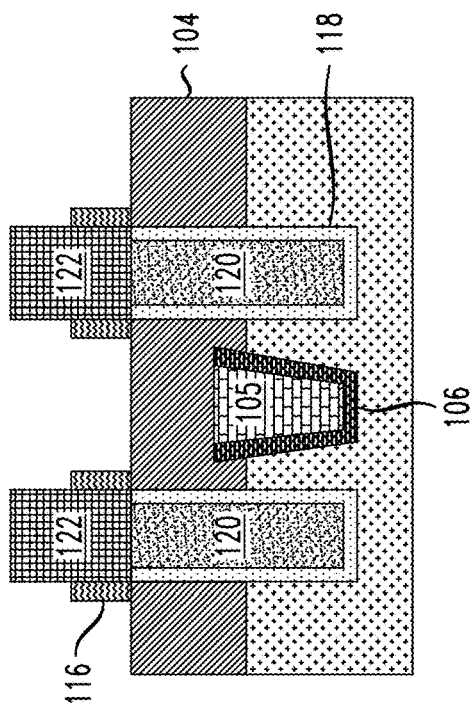
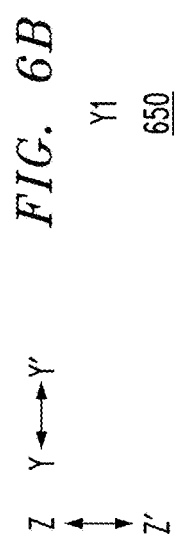
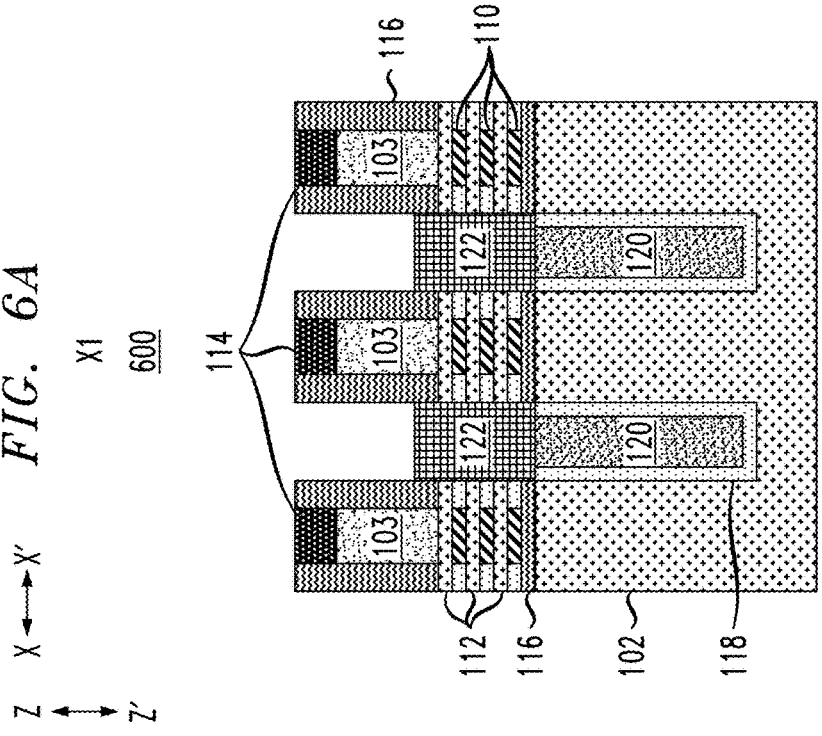
FIG. 6A
FIG. 6B

X2
775

Y2
785

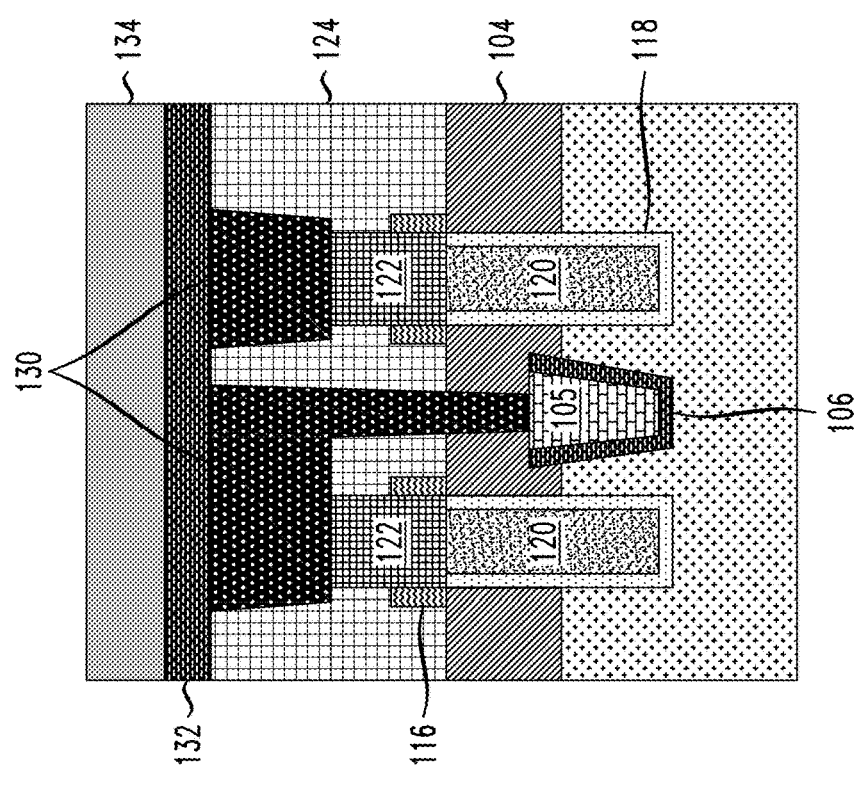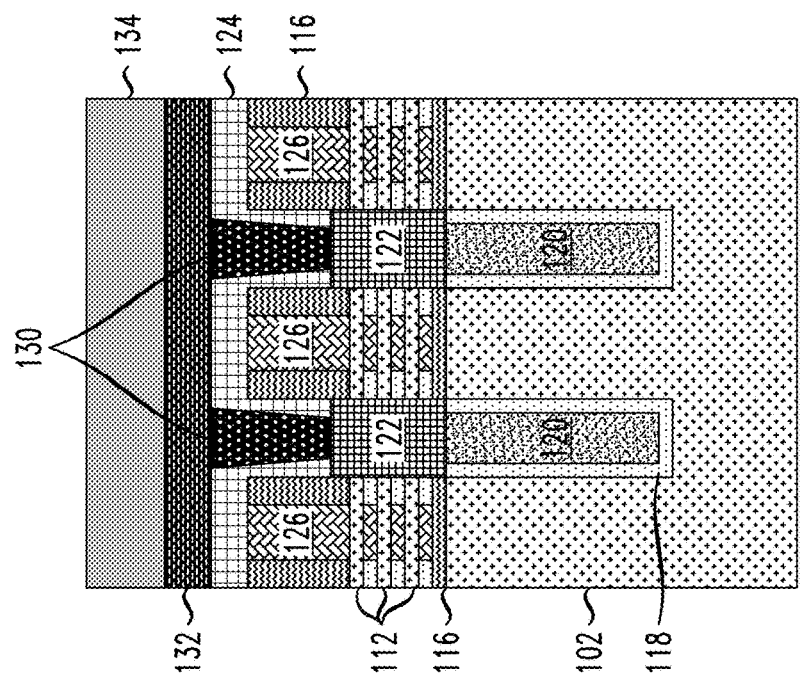

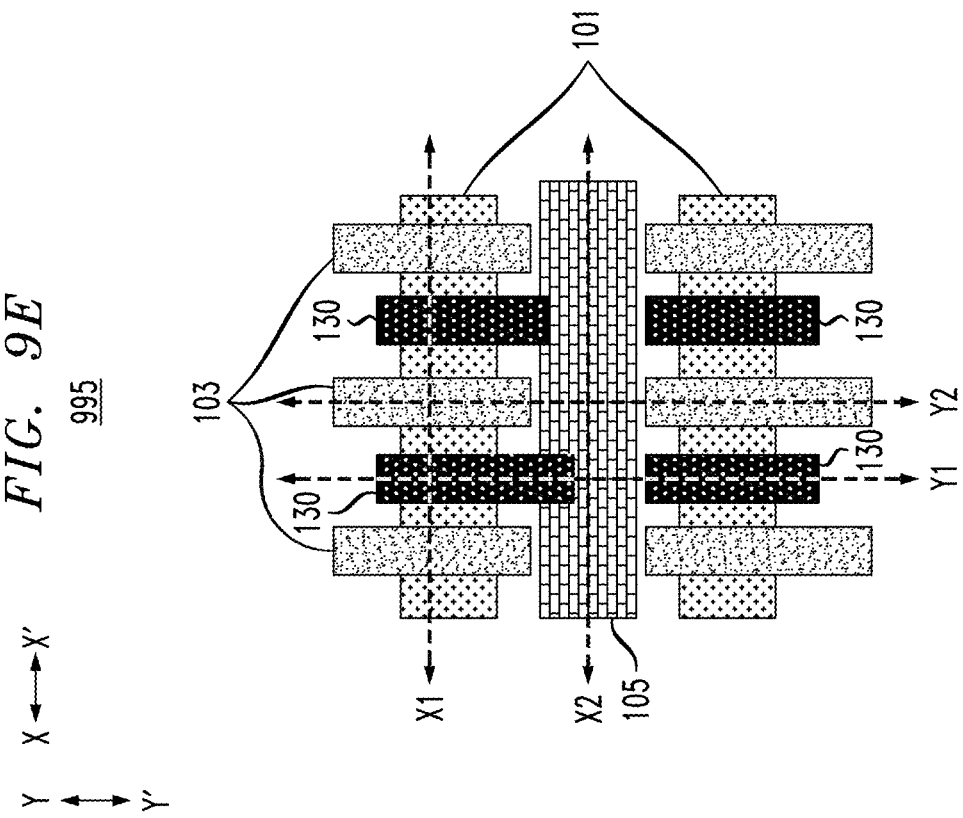

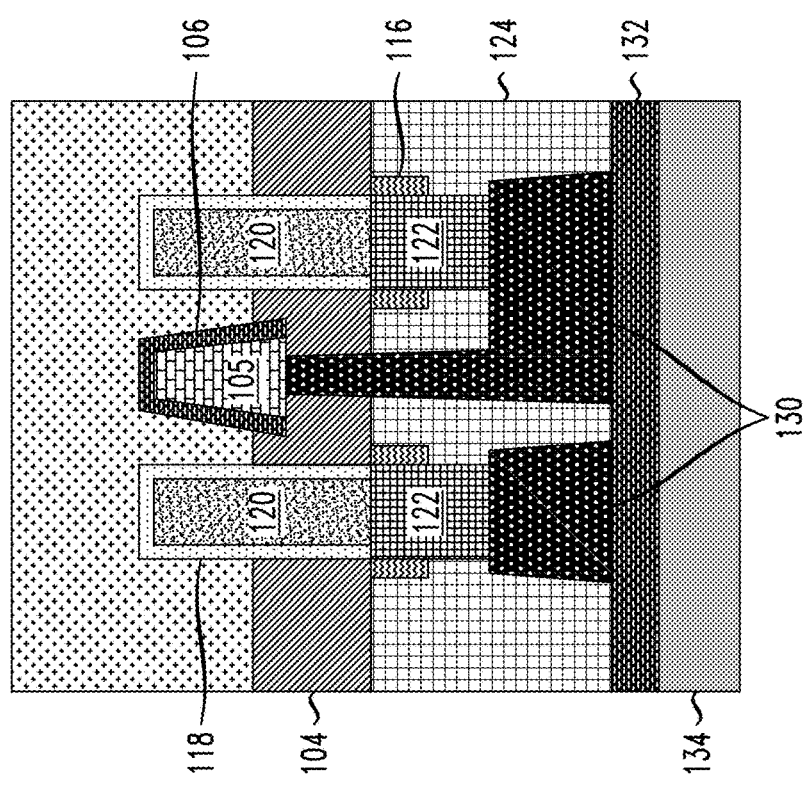
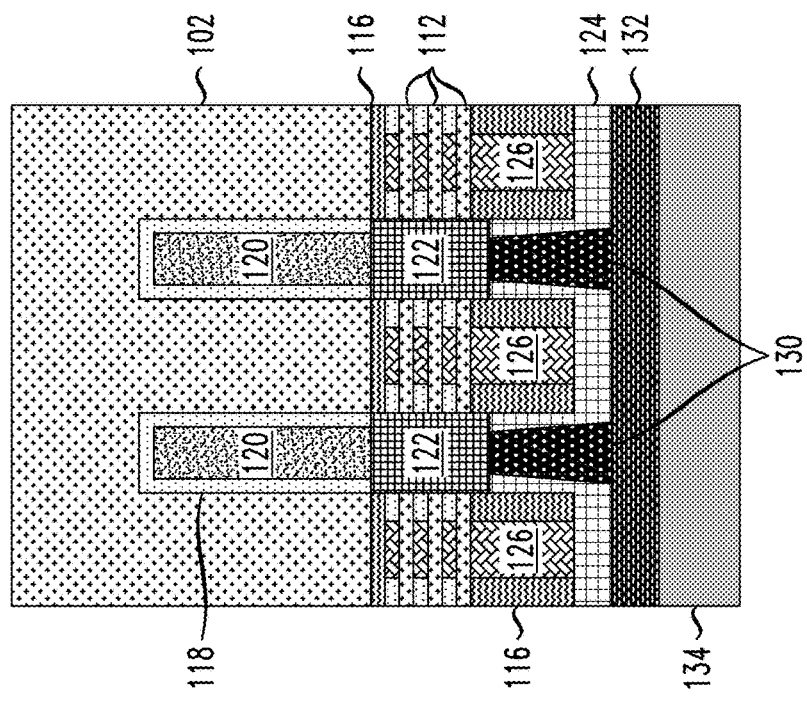

Y2
1085

X2
1075

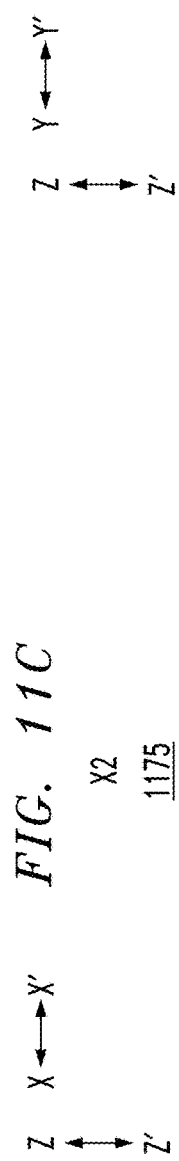
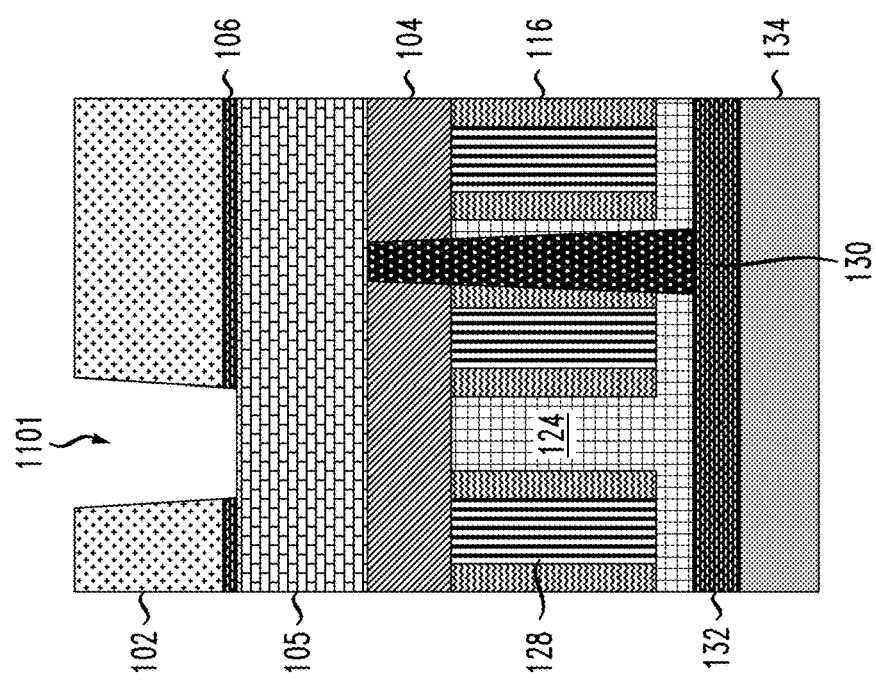
FIG. 11C
FIG. 11D

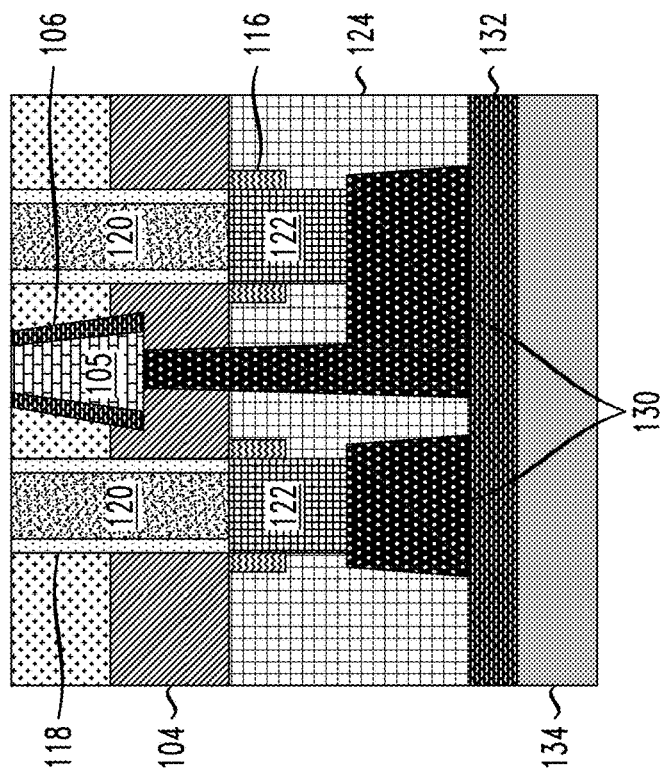
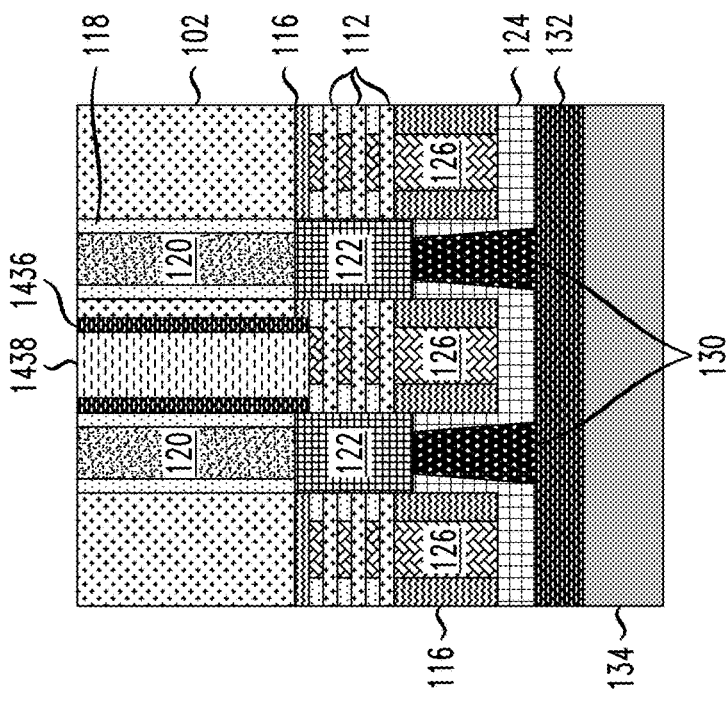

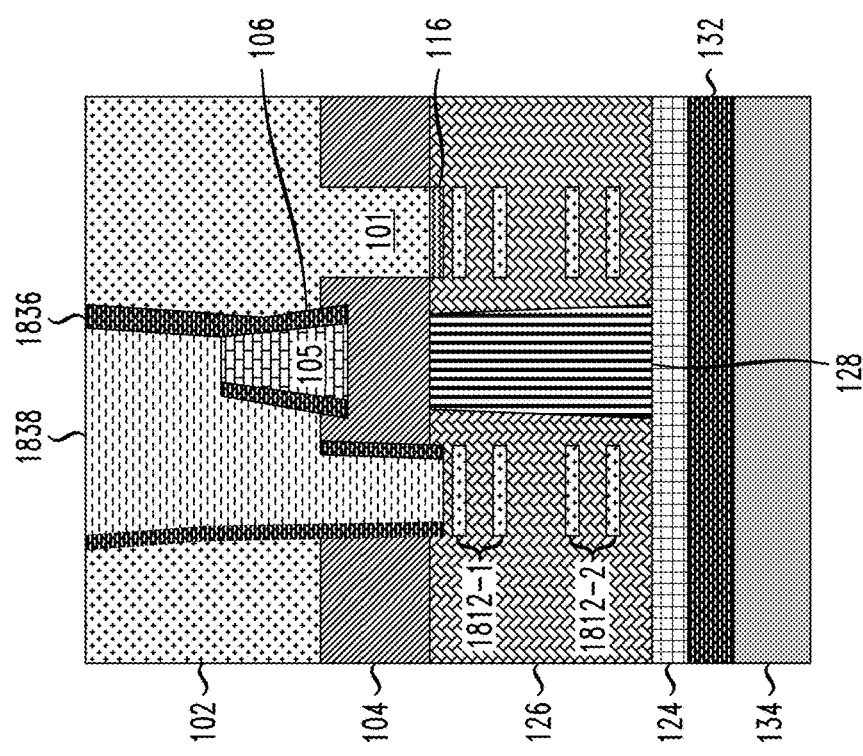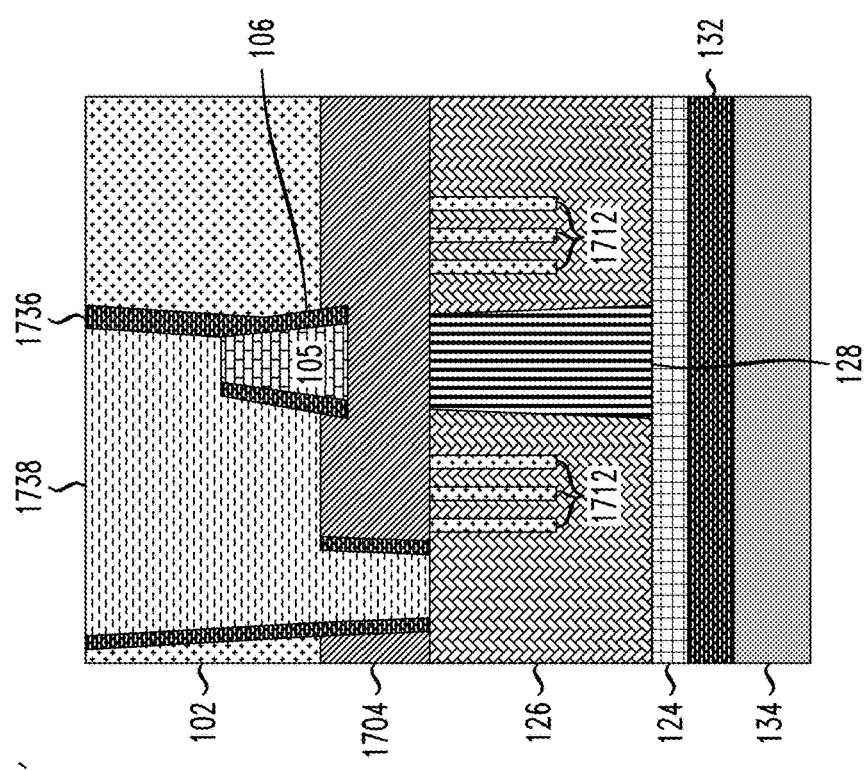

SEMICONDUCTOR STRUCTURES WITH BACKSIDE GATE CONTACTS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming semiconductor structures with backside gate contacts, where the backside gate contacts include at least one of backside gate contacts over active regions and gate tie-down contacts.

In one embodiment, a semiconductor structure comprises a substrate having a first side and a second side opposite the first side, a buried power rail at least partially disposed in the substrate, a gate for at least one transistor device disposed above the first side of the substrate, and a gate tie-down contact connecting the gate to the buried power rail from the second side of the substrate.

In another embodiment, a semiconductor structure comprises a substrate having a first side and a second side opposite the first side, one or more source/drain regions disposed over the first side of the substrate, a gate for at least one transistor device disposed above the first side of the substrate, and a gate contact connecting to a portion of the gate from the second side of the substrate, the portion of the gate being adjacent to at least one of the one or more source/drain regions.

In another embodiment, a method comprises forming a buried power rail at least partially in a substrate, the substrate having a first side and a second side opposite the first side, forming a gate for at least one transistor device over the first side of the substrate, and forming a gate tie-down contact connecting the gate to the buried power rail from the second side of the substrate.

These and other features and advantages of embodiments described herein will become more apparent from the accompanying drawings and the following detailed description.

BRIEF DESCRIPTION OF THE DRAWINGS

FIGS. 1A-1E depict views of a semiconductor structure following nanosheet, shallow trench isolation and buried power rail formation, according to an embodiment of the invention.

FIGS. 2A-2D depict views of the structure of FIGS. 1A-1E following gate patterning, removal of sacrificial layers, spacer deposition, and etching, according to an embodiment of the invention.

FIGS. 3A-3D depict views of the structure of FIGS. 2A-2D following nanosheet recess, deep cavity recess, and indentation of sacrificial layers, according to an embodiment of the invention.

FIGS. 5A-5D depict views of the structure of FIGS. 4A-4D following dielectric recess, according to an embodiment of the invention.

FIGS. 6A-6D depict views of the structure of FIGS. 5A-5D following an isotropic inner spacer liner etch-back followed by source/drain region formation, according to an embodiment of the invention.

FIGS. 9A-9E depict views of the structure of FIGS. 8A-8D following middle-of-line and back-end-of-line processing and bonding to a carrier wafer, according to an embodiment of the invention.

FIGS. 10A-10D depict views of the structure of FIGS. 9A-9E following a wafer flip and substrate thinning, according to an embodiment of the invention.

FIGS. 11A-11E depict views of the structure of FIGS. 10A-10D following backside gate tie-down patterning, according to an embodiment of the invention.

FIGS. 14A-14D depict views of the structure of FIGS. 13A-13E following inner spacer formation and gate contact metallization, according to an embodiment of the invention.

Figures 15E, 15F:
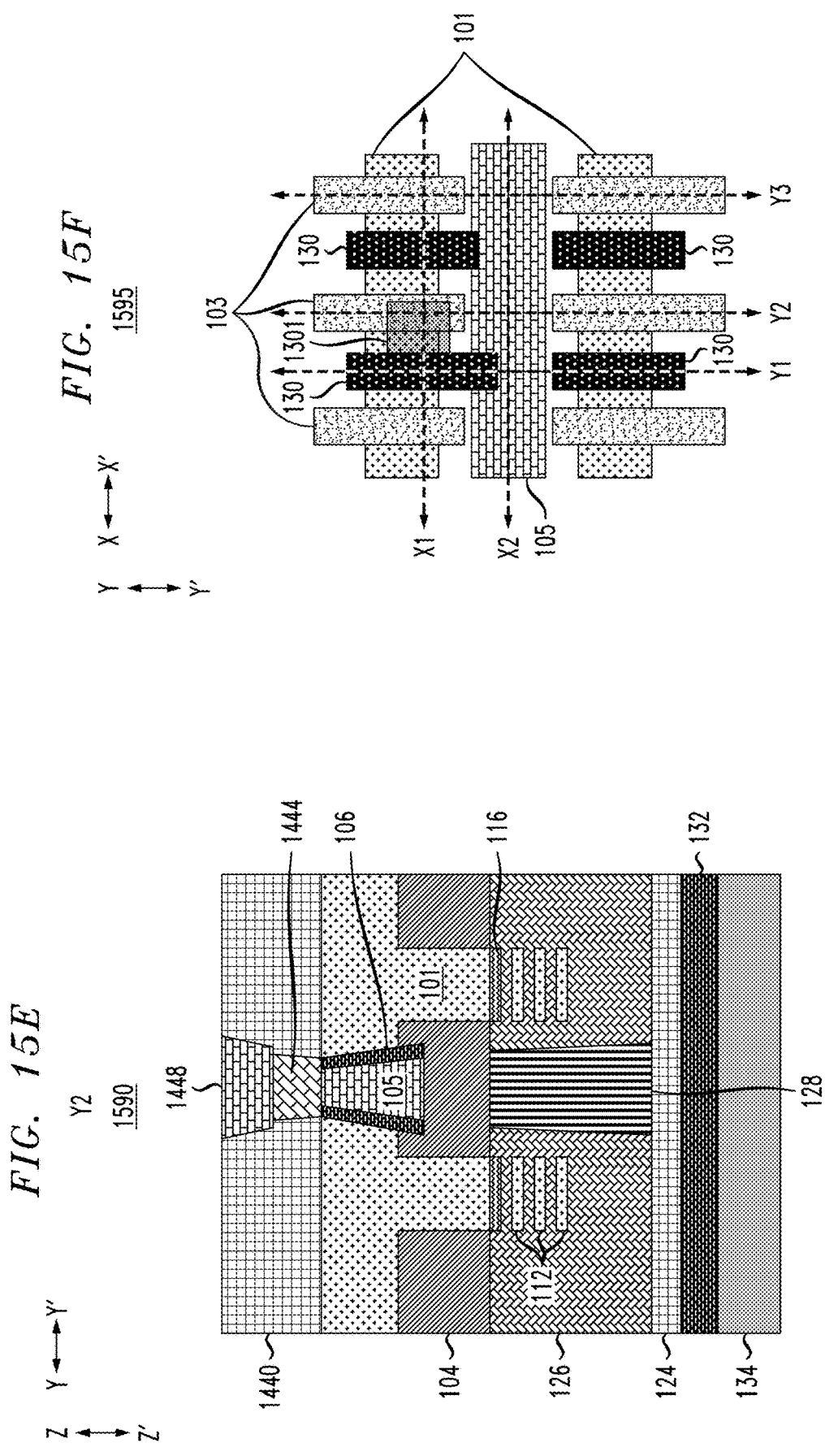

FIGS. 15A-15F depict views of the structure of FIGS. 14A-14D following formation of an interlevel dielectric, additional micro through-silicon-vias, backside signal lines and backside power distribution network wiring, according to an embodiment of the invention.

FIG. 17 depicts a semiconductor structure with a buried power rail and a gate tie-down contact to gate metal to a side of non-gate-all-around fin field-effect transistors, according to an embodiment of the invention.

FIG. 18 depicts a semiconductor structure with a buried power rail and a gate tie-down contact to gate metal surrounding lower and upper channels of lower and upper transistors of a stacked transistor structure, according to an embodiment of the invention.

DETAILED DESCRIPTION

Figure 1B:
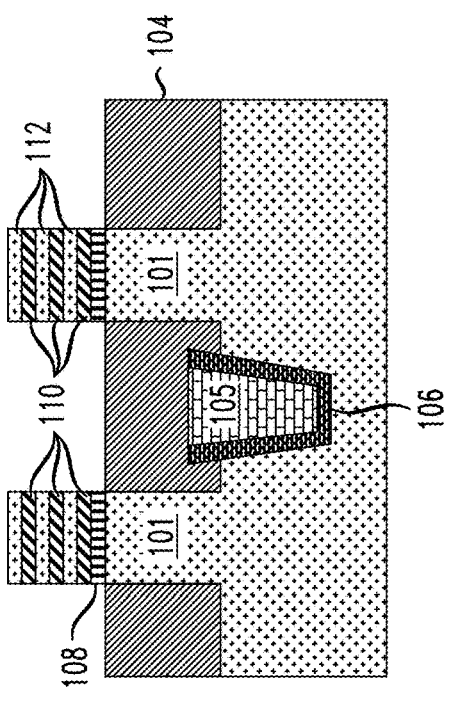

Illustrative embodiments of the invention may be described herein in the context of illustrative methods for forming semiconductor structures with backside gate contacts and/or gate tie-down contacts, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Gate tie-down features provide various advantages for defining dummy gates over continuous active regions of semiconductor structures Gate tie-down features can save costs, as using gate tie-down features avoids the need to form a single diffusion break (SDB). SDB formation undesirably may involve multiple high aspect ratio etches, dielectric fill, and chemical mechanical planarization (CMP) processes. Further, the use of gate tie-down features can avoid issues such as SDB etch-induced epitaxial layer damage. While gate tie-downs save costs (e.g., through avoiding the need for forming a SDB), gate tie-down features and power rails may still occupy a significant amount of area in the wafer frontside.

Illustrative embodiments provide novel methods and structure for forming gate tie-down features from the backside of the wafer. Further, illustrative embodiments enable backside gate contacts over an active region of a semiconductor structure. In some embodiments, a semiconductor structure comprises a buried power rail, a gate structure, and a gate tie-down contact which connects the gate structure to the buried power rail from the backside of the semiconductor structure (e.g., a backside of the wafer). The semiconductor structure may include dielectric isolation pillars formed under source/drain regions, with the dielectric isolation pillars separating the gate tie-down contact from being shorted to the source/drain regions. The semiconductor structure may comprise a nanosheet FET device, where the gate under a bottom nanosheet channel is connected to the gate tie-down contact.

The semiconductor structure may alternatively comprise a gate-all-around (GAA) fin field-effect transistor (FinFET) device, where the gate metal under the fins of the FinFET device are connected to the gate tie-down contact. The semiconductor structure may alternatively comprise a non-GAA FinFET device (e.g., a double-sided or tri-gated FinFET device), where the gate metal which is connected to the gate tie-down contact is not under the fins of the FinFET device and is instead at a lateral (e.g., left or right) side of the fins.

The semiconductor structure may alternatively comprise a stacked transistor device (e.g., a stacked vertical transport FET (VTFET) device), where at least a top or upper FET channel is formed over a bottom or lower FET channel, and wherein the gate metal under the bottom or lower FET channel is connected to the gate tie-down contact. In some embodiments, the gate for both the top (upper) and bottom (lower) FETs are connected to the gate tie-down contact (e.g., to the potential at the buried power rail). In other embodiments, only the gate for the bottom (lower) FETs are connected to the gate tie-down contact (e.g., to the potential at the buried power rail) or only the gate for the top (upper) FETs are connected to the gate tie-down contact (e.g., to the potential at the buried power rail).

A method for forming a semiconductor structure may include: forming a buried power rail; forming a self-aligned dielectric isolation pillar under source/drain regions; flipping the wafer and thinning down the substrate; and forming the gate tie-down contact to connect a gate from the backside of the wafer to the buried power rail, where the gate tie-down contact is separated from the source/drain regions by the dielectric isolation pillar.

In some embodiments, a semiconductor structure comprises at least a gate contact connecting to gate metal from a backside of a wafer, where the gate metal is next to a source/drain region. The semiconductor structure illustratively includes a dielectric isolation pillar under the source/drain region which separates the gate contact from being shorted with the source/drain region.

Illustrative process flows for forming semiconductor structures comprising nanosheet FET devices with backside gate tie-down contacts will now be described with respect to FIGS. 1A-15F. It should be appreciated, however, that similar process flows may be used for forming other types of devices with backside gate tie-down contacts, including but not limited to GAA FinFET devices, non-GAA FinFET devices, stacked transistor devices, etc. as shown in FIGS. 16-20.

Figure 1A:
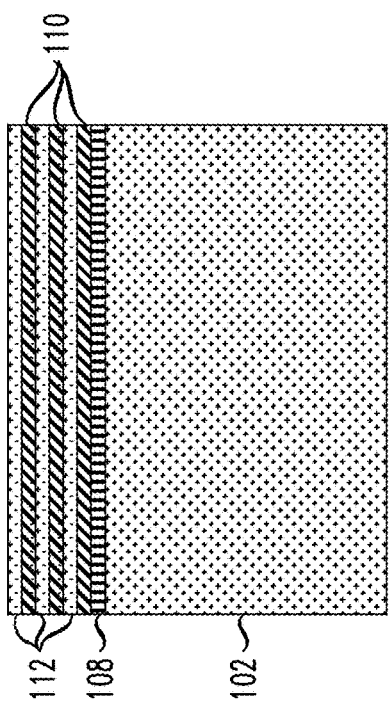
Figure 1D:
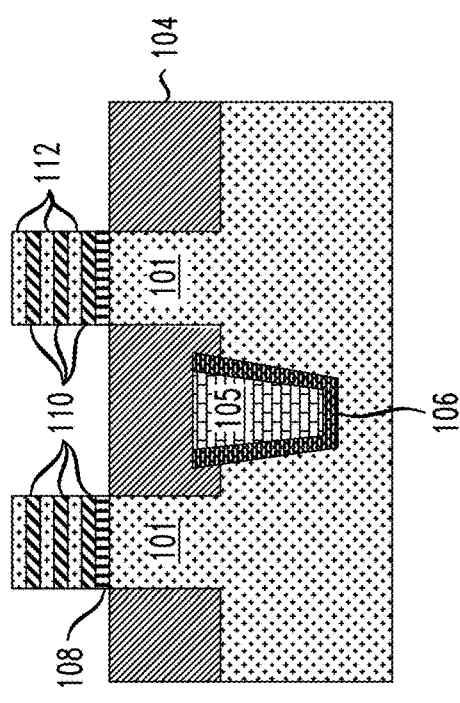
Figure 1C:
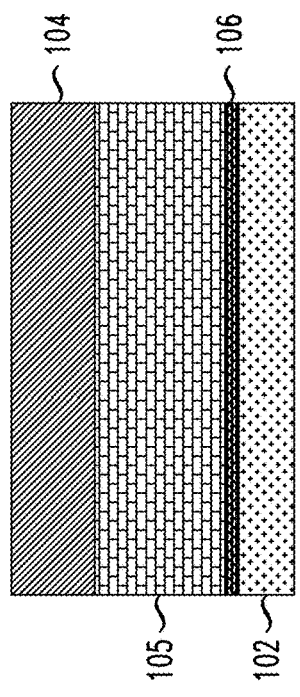
Figure 2C:
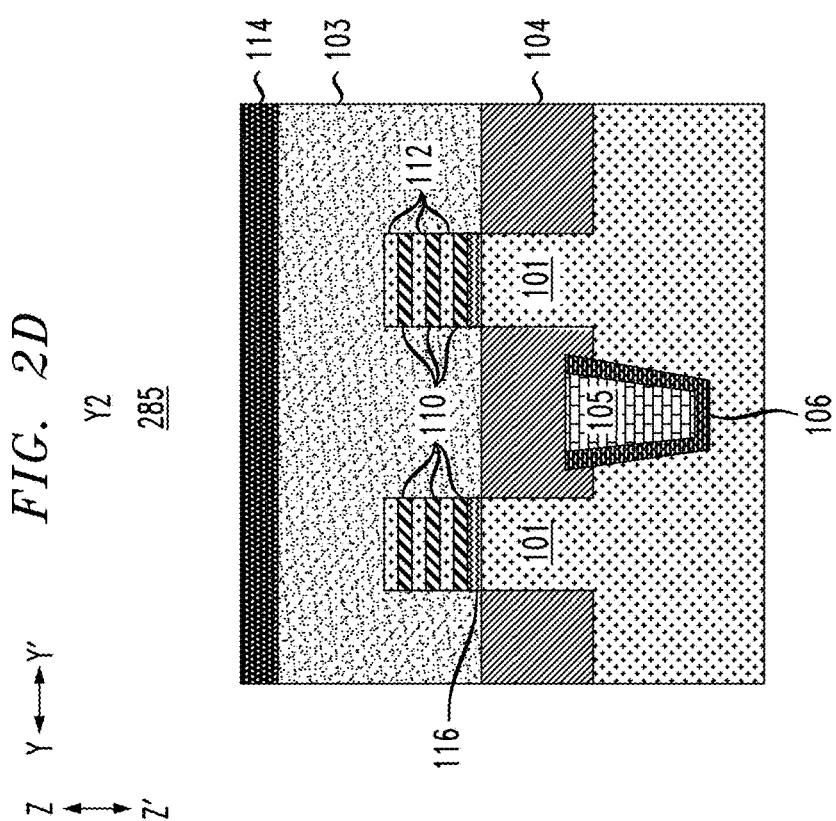
Figure 2D:
Figure 3D:
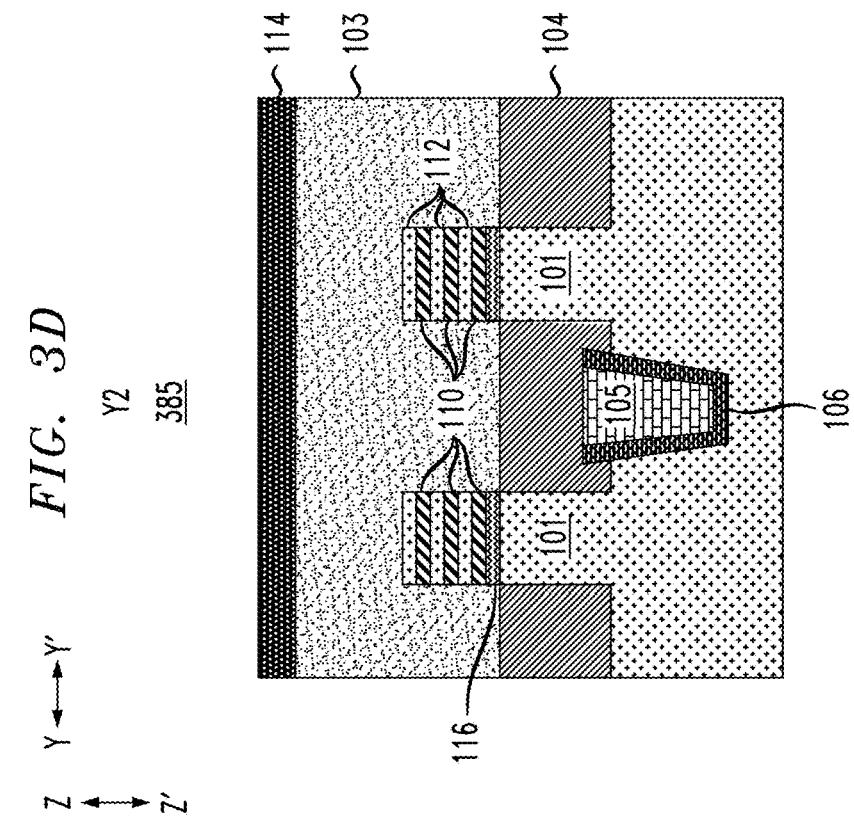
Figure 3C:
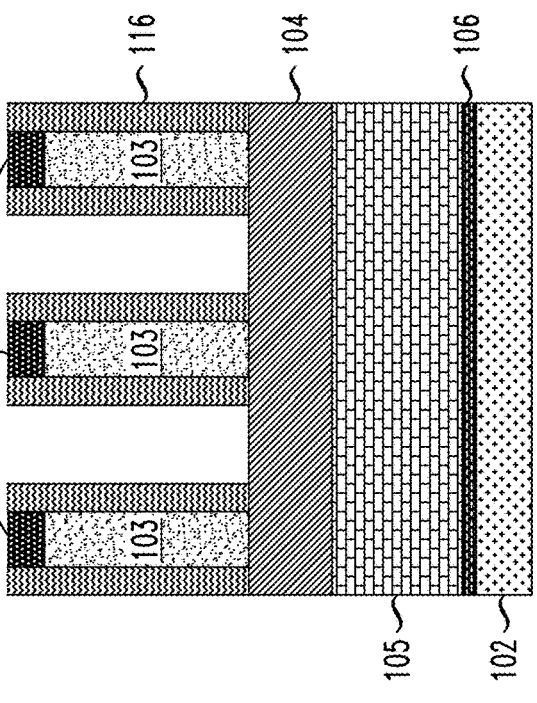
Figure 4B:
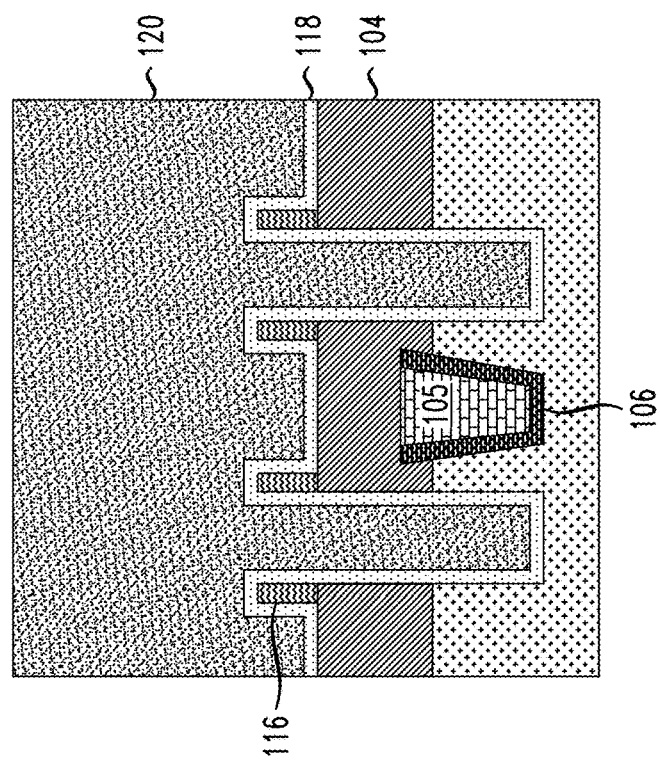
FIGS. 4A-4D depict views of the structure of FIGS. 3A-3D following deposition of an inner spacer liner and dielectric overfill, according to an embodiment of the invention.
Figure 4A:
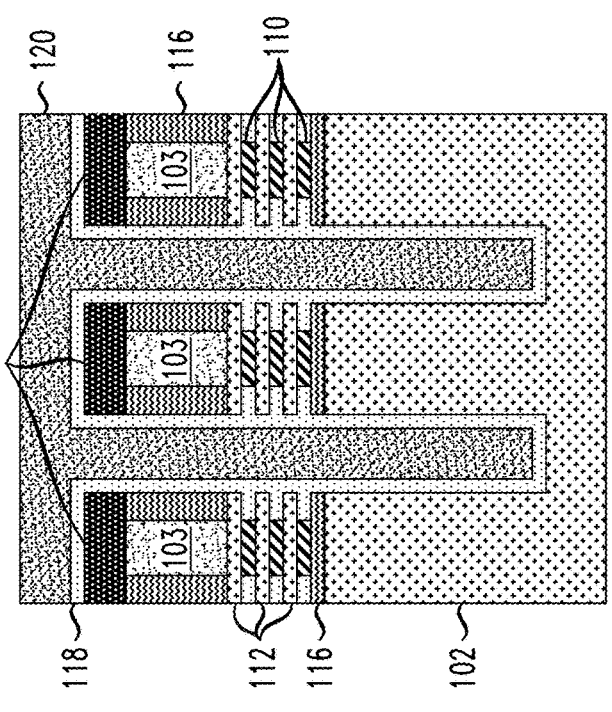
Figure 4D:
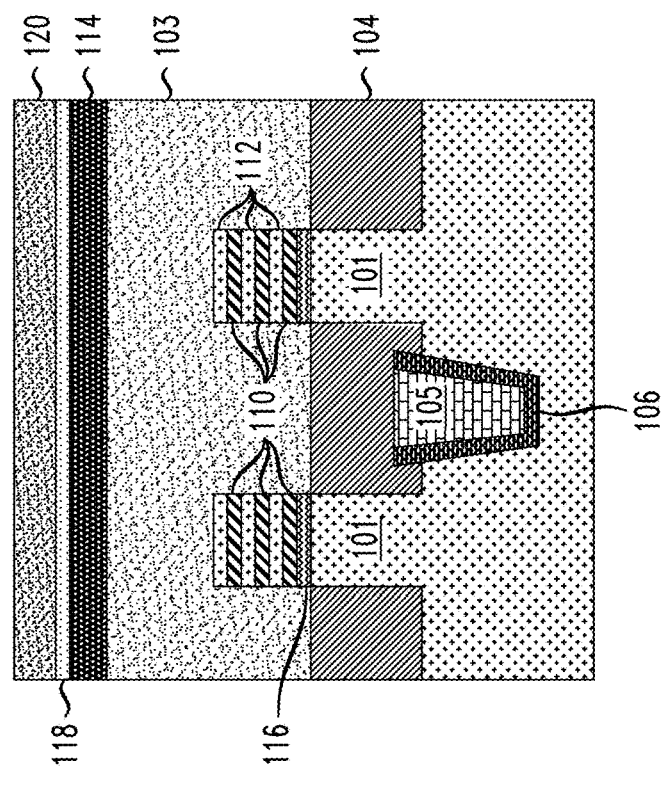
Figure 4C:
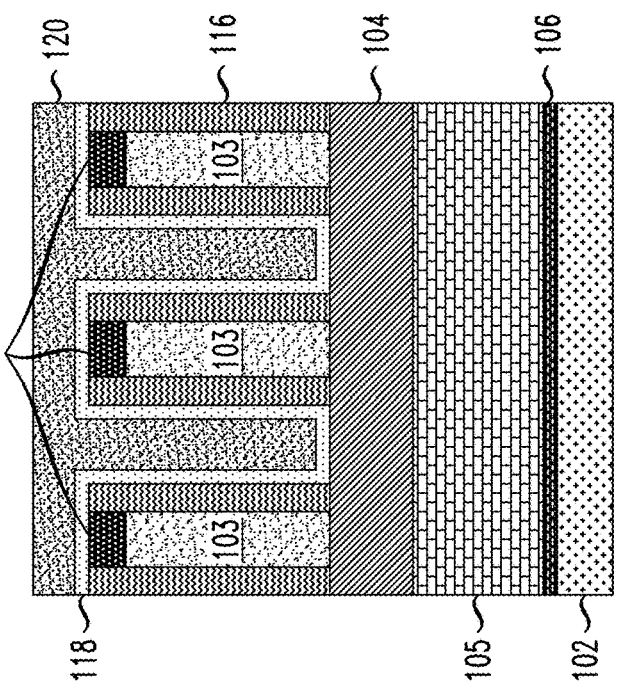
Figure 5C:
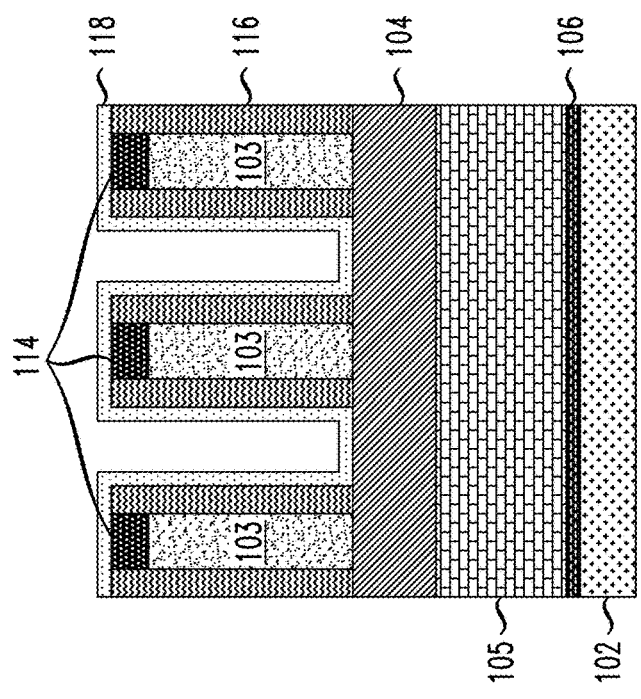
Figure 5D:
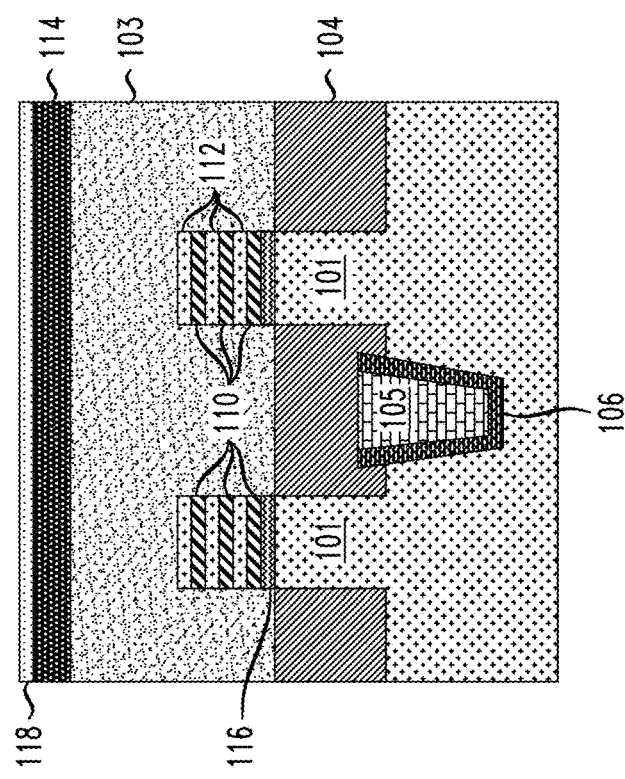
Figure 6D:
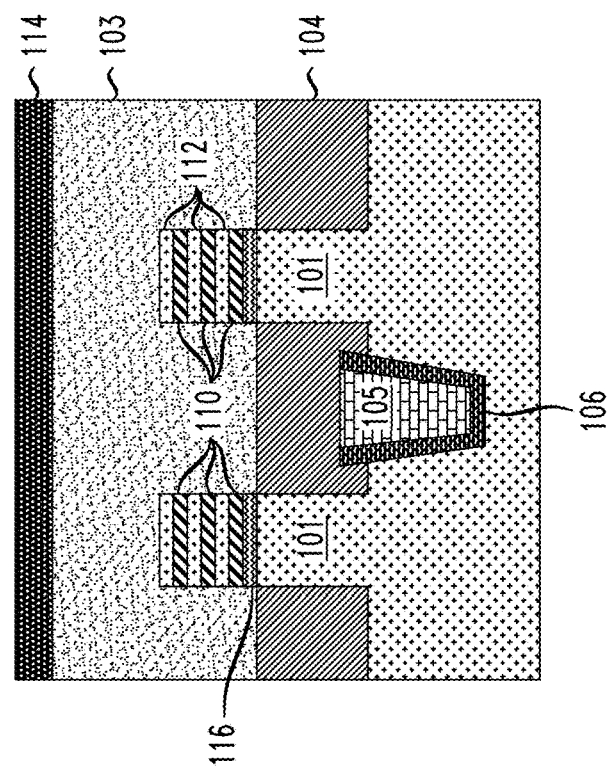
Figure 6C:
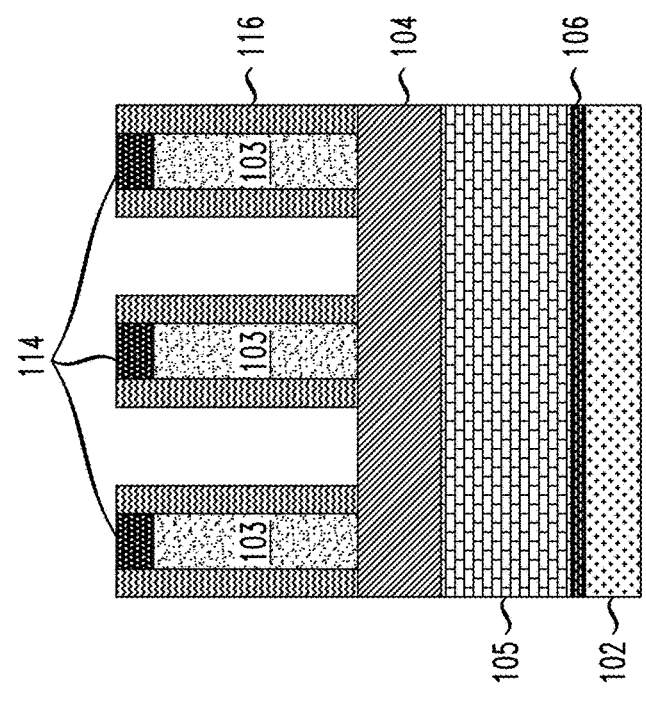
Figure 7B:
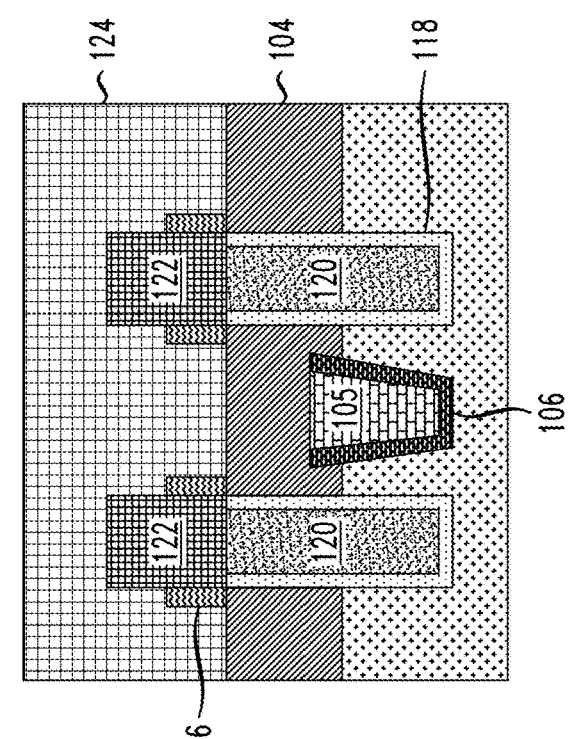
FIGS. 7A-7D depicts views of the structure of FIGS. 6A-6D following formation of an interlevel dielectric layer, according to an embodiment of the invention.
Figure 7A:
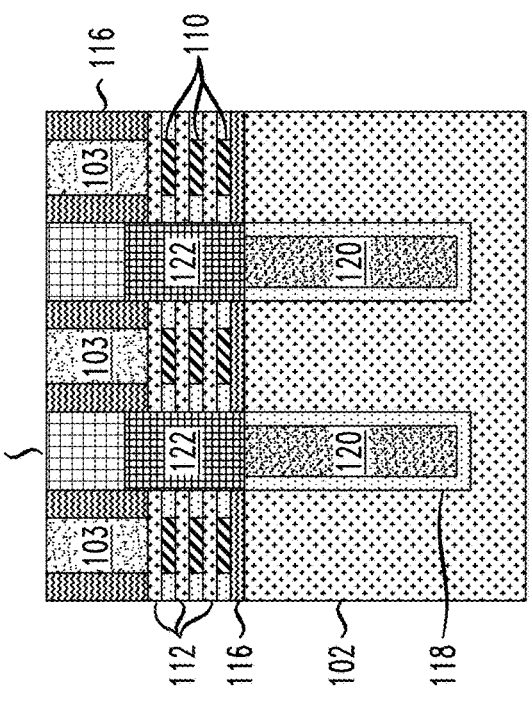
Figure 7C:
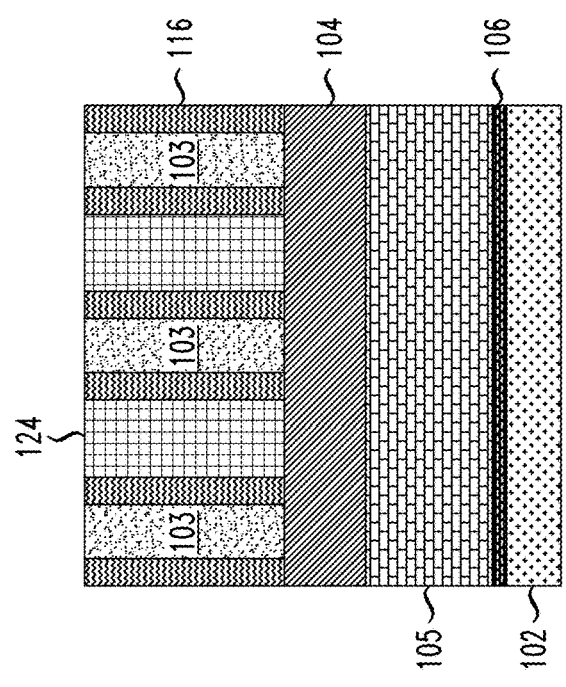
Figure 7D:
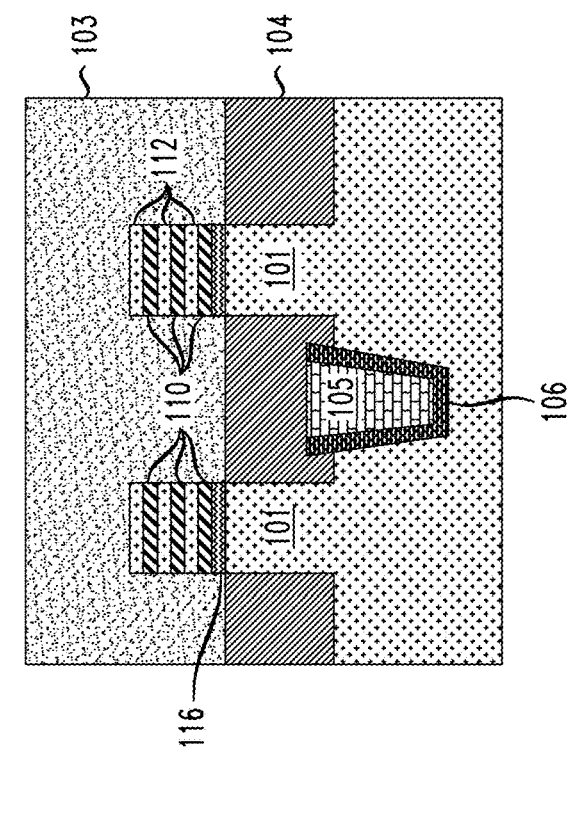

FIGS. 1A-1E show respective views 100, 150, 175, 185 and 195 of a semiconductor structure. FIG. 1A more particularly shows a cross-sectional view 100 taken along the X1 line shown in the top-down view 195 of FIG. 1E, FIG. 1B shows a cross-sectional view 150 taken along the Y1 line shown in the top-down view 195 of FIG. 1E, FIG. 1C shows a cross-sectional view 175 taken along the X2 line shown in the top-down view 195 of FIG. 1E, and FIG. 1D shows a cross-sectional view 185 taken along the Y2 line shown in the top-down view 195 of FIG. 1E. Unless otherwise noted, similarly numbered views in subsequent figures are taken along the same lines shown in the top-down view 195 of FIG. 1E: views 200 of FIG. 2A, 300 of FIG. 3A, 400 of FIG. 4A, etc. are similarly taken along line X1; views 250 of FIG. 2B, 350 of FIG. 3B, 450 of FIG. 4B, etc. are similarly taken along line Y1; views 275 of FIG. 2C, 375 of FIG. 3C, 475 of FIG. 4C, etc. are similarly taken along line X2; views 285 of FIG. 2D, 385 of FIG. 3D, 485 of FIG. 4D, etc. are similarly taken along line Y2.

The semiconductor structure of FIGS. 1A-1E is shown after formation of a nanosheet stack over fins 101 formed over a substrate 102. A shallow trench isolation (STI) region 104 is formed surrounding the fins 101 over the substrate, with a buried power rail (BPR) 105 being formed in the substrate between the two fins 101. The BPR 105 is surrounded by a dielectric spacer 106. The nanosheet stacks include a sacrificial layer 108, and then alternating layers of sacrificial layer 110 and nanosheet channel layers 112. The top-down view 195 of FIG. 1E illustrates regions where dummy gates 103 will be formed in subsequent processing, and shows that the line X1 (corresponding to the cross-sectional view 100 of FIG. 1A) is taken along one of the fins 101, that the line X2 (corresponding to the cross-sectional view 150 of FIG. 1B) is taken along the BPR 105, that the line Y1 (corresponding to the cross-sectional view 175 of FIG. 1C) is taken across the fins 101 between where two of the dummy gates 103 are to be formed, and that the line Y2 (corresponding to the cross-sectional view 185 of FIG. 1D) is taken across the fins 101 where one of the dummy gates 103 is to be formed.

The substrate 102 and fins 101 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The width (in directions X-X' and Y-Y') of the substrate 102 may vary, such as based on the number of fins 101 and dummy gates 103 that are to be formed therefrom as described in further detail below. Each of the fins 101 may have a width (in direction Y-Y') in the range of 10 to 100 nanometers (nm), and a height (in direction Z-Z') in the range of 30 to 150 nm.

The STI region 104 may be formed of a dielectric material such as silicon dioxide ($SiO_2$), silicon oxycarbide (SiOC), silicon oxynitride (SiON), etc. The STI region 104 may have widths (in directions X-X' and Y-Y') matching the underlying structure (e.g., substrate 102), and may have a height (in direction Z-Z') matching that of the fins 101.

The BPR 105 may be formed of a metal material such as ruthenium (Ru), tungsten (W), cobalt (Co), molybdenum (Mo), etc., with a thin adhesion metal liner. The BPR 105 may have a width (in direction X-X') that matches the underlying structure (e.g., substrate 102), a width (in direction Y-Y') in the range of 10 to 200 nm. The BPR 105 may have a height (in direction Z-Z') in the range of 30 to 200 nm. The BPR 105, as shown, is formed at least partially below the fins 101 and STI region 104 in the substrate 102. The BPR 105 is surrounding by dielectric spacer 106, which may be formed of a dielectric material such as silicon nitride (SiN), silicon dioxide ($SiO_2$), silicon boron carbide nitride (SiBCN), silicon oxycarbonitride (SiOCN), silicon oxycarbide (SiOC), silicon carbide (SiC), combinations thereof, etc. The dielectric spacer 106 may have a uniform thickness in the range of 5 to 20 nm.

The sacrificial layer 108 and sacrificial layers 110 are illustratively formed of different sacrificial materials, such that they may be etched or otherwise removed selective to one another. In some embodiments, both the sacrificial layer 108 and sacrificial layers 110 are formed of SiGe, but with different percentages of Ge. For example, the sacrificial layer 108 may have a relatively higher percentage of Ge (e.g., 55% Ge), and the sacrificial layers 110 may have a relatively lower percentage of Ge (e.g., 25% Ge). Other combinations of different sacrificial materials may be used in other embodiments. The sacrificial layers 108 and 110 may each have a thickness (in direction Z-Z') in the range of 6-15 nm, and a width (in direction Y-Y') which matches that of the underlying fins 101.

The nanosheet channel layers 112 may be formed of Si or another suitable material (e.g., a material similar to that used for the substrate 102 and fins 101). Each of the nanosheet channels 112 may have a thickness (in direction Z-Z') in the range of 4-10 nm, and a width (in direction Y-Y') which matches that of the underlying fins 101.

FIGS. 2A-2D show respective cross-sectional views 200, 250, 275 and 285 of the FIGS. 1A-1E structure following gate patterning using a hard mask layer 114, removal of the sacrificial layer 108, and formation of spacer layer 116.

The gate patterning may include forming the dummy gates 103 by blanket deposition of material of the dummy gates 103 (e.g., amorphous silicon (a-Si), amorphous silicon germanium (a-SiGe), over a thin $SiO_2$ or titanium nitride (TiN) layer, or another suitable material) and material of the hard mask layer 114 (e.g., silicon nitride (SiN), a multi-layer of SiN and $SiO_2$, or another suitable material), followed by lithographic processing to result in the patterned hard mask layer 114 and underlying dummy gates 103 shown in FIGS. 2A-2D. Each of the dummy gates 103 may have a width (in direction X-X') in the range of 12 to 100 nm, and a height (in direction Z-Z') in the range of 30 to 100 nm. The hard mask layer 114 may have a width (in direction X-X') matching that of the underlying dummy gates 103, and a height (in direction Z-Z') in the range of 20 to 100 nm.

Following gate patterning, the sacrificial layer 108 may be removed using a wet or dry etch that removes material of the sacrificial layer 108 selective to the material of the sacrificial layers 110. After the sacrificial layer 108 is removed, a spacer layer 116 is formed as shown. The material of the spacer layer 116 may initially be formed over the entire structure, including in the regions exposed by removal of the sacrificial layer 108, and is then etched (e.g., using reactive-ion etching (ME)) such that is remains only in the areas shown. The spacer layer 116 formed below the bottommost sacrificial layer 110 and nanosheet channel layer 112 provides a bottom dielectric isolation (BDI) layer. The spacer layer 116 is also formed on sidewalls of the dummy gates 103 and hard mask layer 114.

FIGS. 3A-3D show respective cross-sectional views 300, 350, 375 and 385 of the FIGS. 2A-2D structure following recess of the nanosheet stack in regions left exposed by the hard mask layer 114 and spacer layer 116, a further deep cavity recess into the STI region 104 and substrate 102, and following indentation of the sacrificial layers 110. The recess of the nanosheet stack and deep cavity recess may be performed utilizing RIE or other suitable processing, and the indentation of the sacrificial layers 110 may be performed using an indent etch (e.g., of the SiGe25%) material. The deep cavity recess into the substrate 102 may be performed to a depth that matches the bottom surface of the BPR 105 and surrounding dielectric spacer 106. The indent etch of the sacrificial layers 110 may be to a depth that matches the width (in direction X-X') of the spacer layer 116 surrounding the dummy gates 103 (e.g., such that the width in direction X-X' of the indented sacrificial layers 110 matches the width in direction X-X' of the dummy gates 103).

FIGS. 4A-4D show respective cross-sectional views 400, 450, 475 and 485 of the FIGS. 3A-3D structure following formation of an inner spacer liner 118 and dielectric layer 120. The inner spacer liner 118 is formed to fill the indent spaces resulting from the indent etch of the sacrificial layers 110, and also lines the deep cavity recess and remaining portions of the structure. The inner spacer liner 118 may be formed of SiN or another suitable material such as silicon boron carbide nitride (SiBCN), silicon carbide oxide (SiCO), silicon oxycarbonitride (SiOCN), etc. The thickness of the inner spacer liner 118 (e.g., on sidewalls and bottoms of the deep cavity recesses) may be in the range of 2-10 nm. The dielectric layer 120 may be formed using a dielectric overfill process to completely fill the deep cavity recesses and overfill the entire structure as illustrated. The dielectric layer 120 may comprise flowable SiOC, $SiO_2$ or another suitable material.

FIGS. 5A-5D show respective cross-sectional views 500, 550, 575 and 585 of the FIGS. 4A-4D structure following recess of the dielectric layer 120. The dielectric layer 120 is recessed to match a top surface of the STI region 104 (e.g., a bottom of the portion of the spacer layer 116 providing the BDI below the nanosheet stacks).

FIGS. 6A-6D show respective cross-sectional views 600, 650, 675 and 685 of the FIGS. 5A-5D structure following an isotropic etch-back of the inner spacer liner 118 and following formation of source/drain regions 122. The isotropic etch-back of the inner spacer liner 118 removes portions of the inner spacer liner 118 formed on top surfaces of the HM layer 114 and spacer layer 116 (but leaves the portions of the inner spacer liner 118 formed in the indent regions of the nanosheet stacks). The remaining portions of the dielectric layer 120 (lined with the inner spacer liner 118) in the STI region 104 and substrate 102 provide "dielectric pillars" as referred to elsewhere herein.

The source/drain regions 122 are grown epitaxially from the exposed nanosheet sidewall above the dielectric pillars, and may have a height (in direction Z-Z') that exceeds the height of the surrounding nanosheet stacks. The source/drain regions 122 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The source/drain regions 122 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

FIGS. 7A-7D show respective cross-sectional views 700, 750, 775 and 785 of the FIGS. 6A-6D structure following formation of an interlevel dielectric (ILD) layer 124. Material of the ILD layer 124 may initially be formed to overfill the structure, and is then recessed (e.g., using RIE, CMP or other suitable processing). The recess of the material of the ILD layer 124 also removes the hard mask layer 114 and portions of the spacer layer 116 on sidewalls of the hard mask layer 114. As a result, the ILD layer 124 has a top surface that matches that of the surrounding dummy gates 103. The ILD layer 124 may be formed of any suitable isolating material, such as $SiO_2$, SiOC, SiON, etc.

Figure 8A:
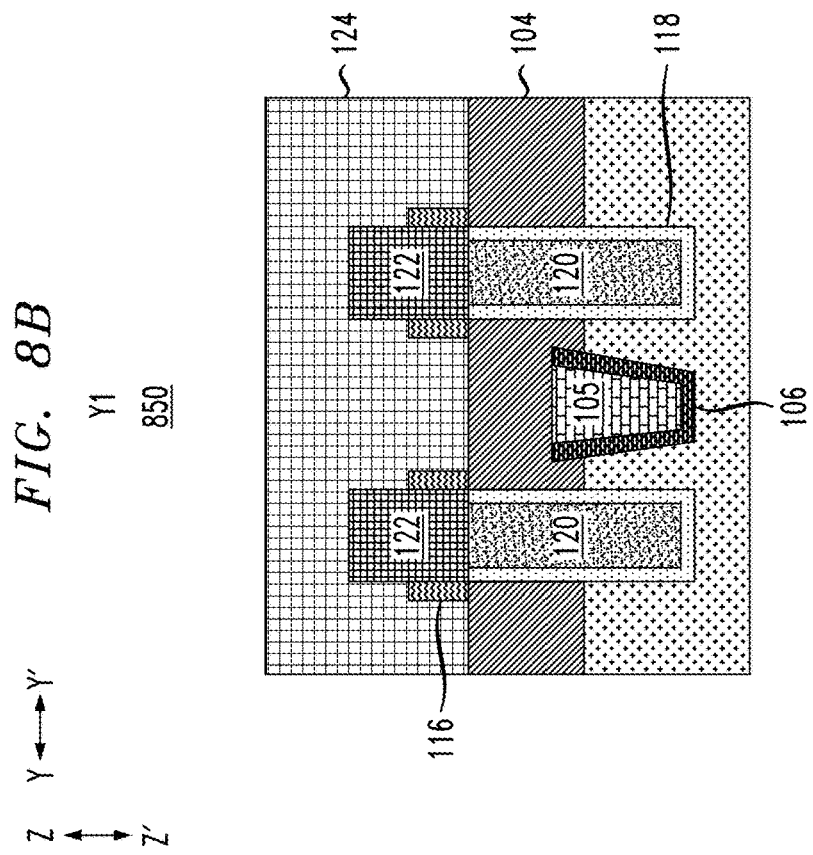
FIGS. 8A-8D depict views of the structure of FIGS. 7A-7D following gate cuts and replacement metal gate processing, according to an embodiment of the invention.
Figure 8B:
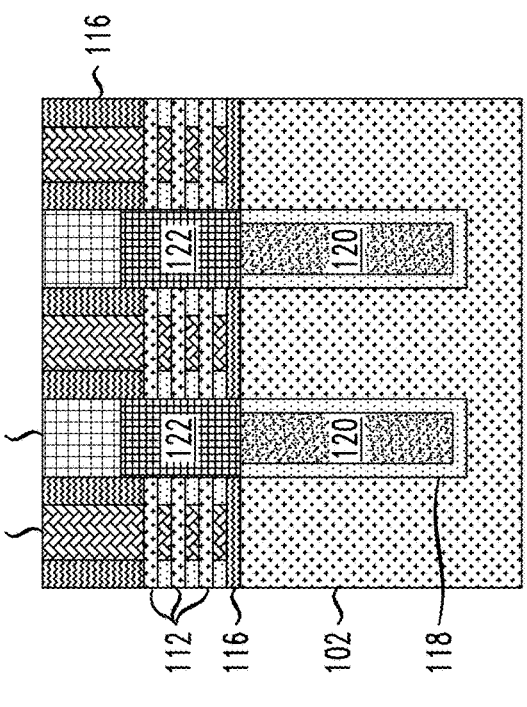
Figure 8D:
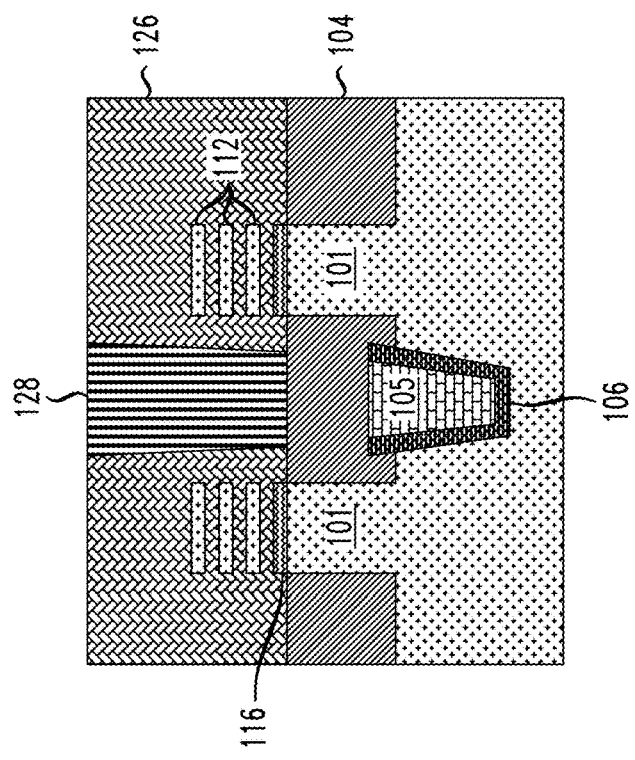
Figure 8C:
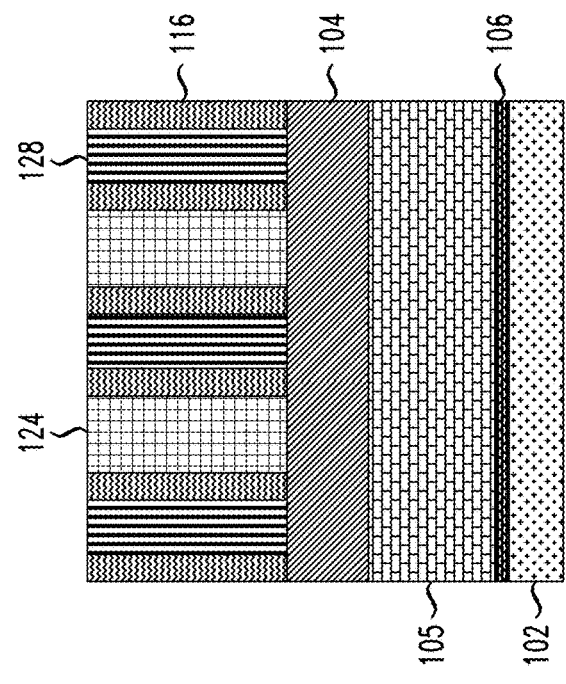

FIGS. 8A-8D show respective cross-sectional views 800, 850, 875 and 885 of the FIGS. 7A-7D structure following gate cuts and replacement gate (RMG) processing. The RMG processing includes removal of the dummy gates 103 and the sacrificial layers 110 from the nanosheet stack, and formation of a high-k metal gate 126 in regions exposed by removal of the dummy gates 103 and the sacrificial layers 110. Gate cuts 128 are then formed as illustrated in FIGS. 8C and 8D, to provide separation between nanosheet FETs formed from each of the fins 101. The high-k metal gate 126 may be formed of a high-k gate dielectric layer such as hafnium dioxide ($HfO_2$), zirconium dioxide ($ZrO_2$), hafnium silicate ($HfSiO_x$), hafnium aluminate ($HfAlO_x$), etc., followed by work function metal (WFM) such as titanium nitride (TiN), titanium carbide (TiC), a titanium-aluminum (Ti—Al) alloy, a titanium-aluminum-carbon (TiAlC) alloy, tantalum nitride (TaN), etc., or another suitable metal material. In some embodiments, a conductive metal such as tungsten (W) or aluminum (Al) may be deposited over the WFM. The gate cuts 128 may be formed of a dielectric material such as SiN, SiOC, etc. The gate cuts 128 may be formed with a height (in direction Z-Z') matching that of the sidewall spacer layer 116, and a width (in direction Y-Y') that is less than that of the distance (in direction Y-Y') between the fins 101.

Figure 9D:
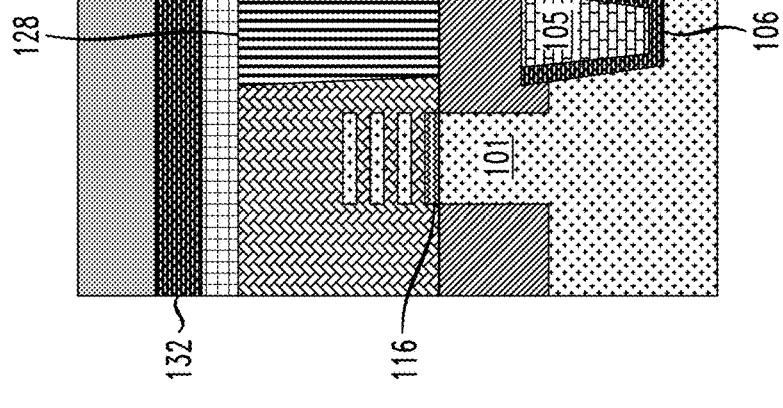
Figure 9C:
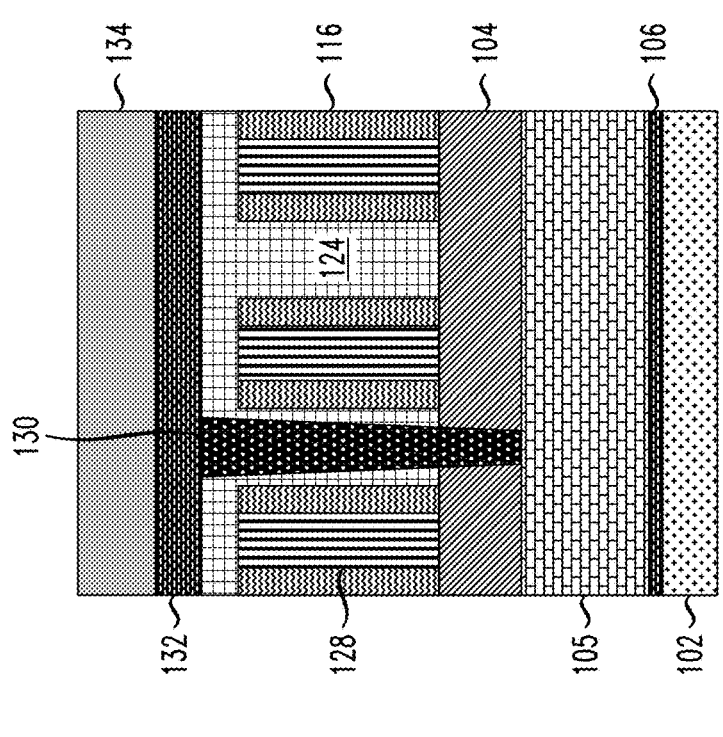
Figure 10D:
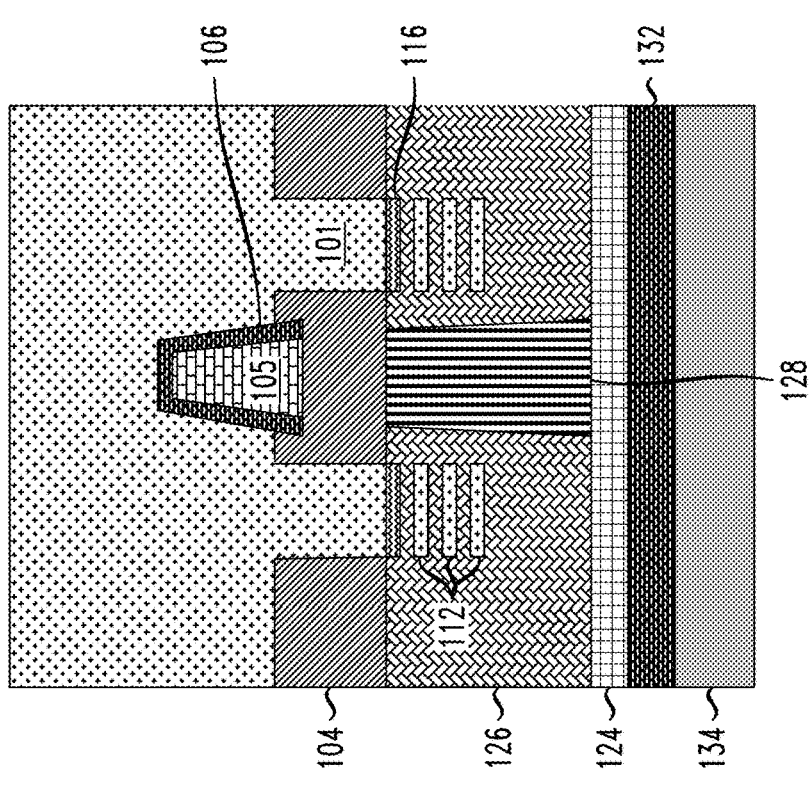
Figure 10C:
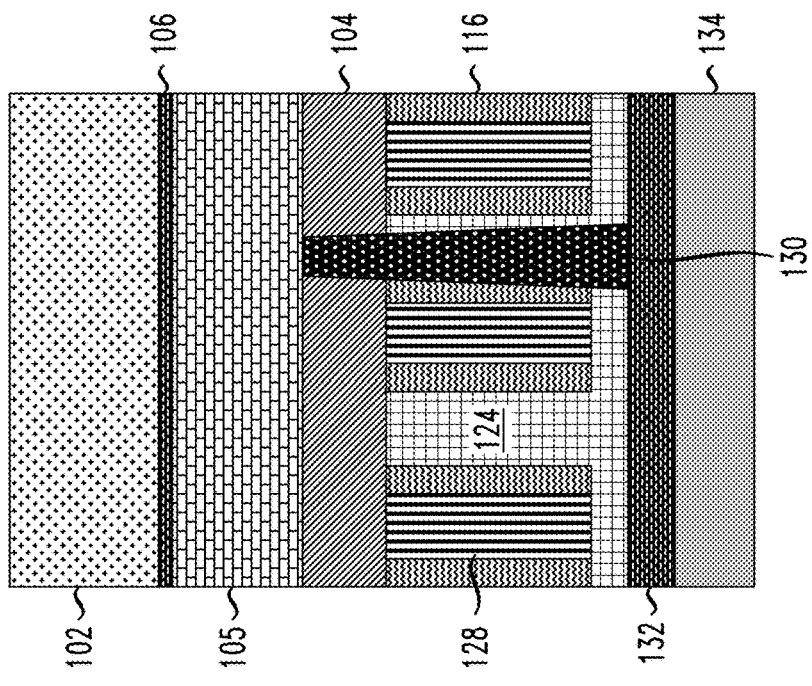

FIGS. 9A-9E show respective cross-sectional views 900, 950, 975 and 985, and a top-down view 995, of the FIGS. 8A-8D structure following middle-of-line (MOL) and back-end-of-line (BEOL) processing as well as bonding of the structure to a carrier wafer 134. The MOL processing includes formation of MOL interconnects 130 to various portions of the structure, including to the source/drain regions 122 and the BPR 105. As shown, one of the MOL interconnects 130 connects one of the source/drain regions 122 with the BPR 105. The MOL interconnects 130 may be formed of metal materials. In some embodiments, the MOL interconnects include a silicide layer over the source/drain epitaxial surface, a metal adhesion layer (e.g., such as TiN) over the silicide, and a low resistance metal layer (e.g., Ru, W, Co, etc.) filled over the metal adhesion layer. BEOL interconnect 132 connects with the MOL interconnects 130 as shown. Prior to the MOL and BEOL processing, additional ILD material may be deposited over the structure, such that there is a gap (in direction Z-Z') between the BEOL interconnect 132 and the top surfaces of the high-k metal gate 126 and gate cuts 128. The carrier wafer 134 is then bonded to the BEOL interconnect 132, with the carrier wafer being formed of Si or another suitable material similar to that of the substrate 102. The top-down view 995 of FIG. 9E provides further illustration of where the MOL interconnects 130 are formed.

FIGS. 10A-10D show respective cross-sectional views 1000, 1050, 1075 and 1085 of the FIGS. 9A-9E structure following a wafer flip and thinning of the substrate 102.

Figure 11B:
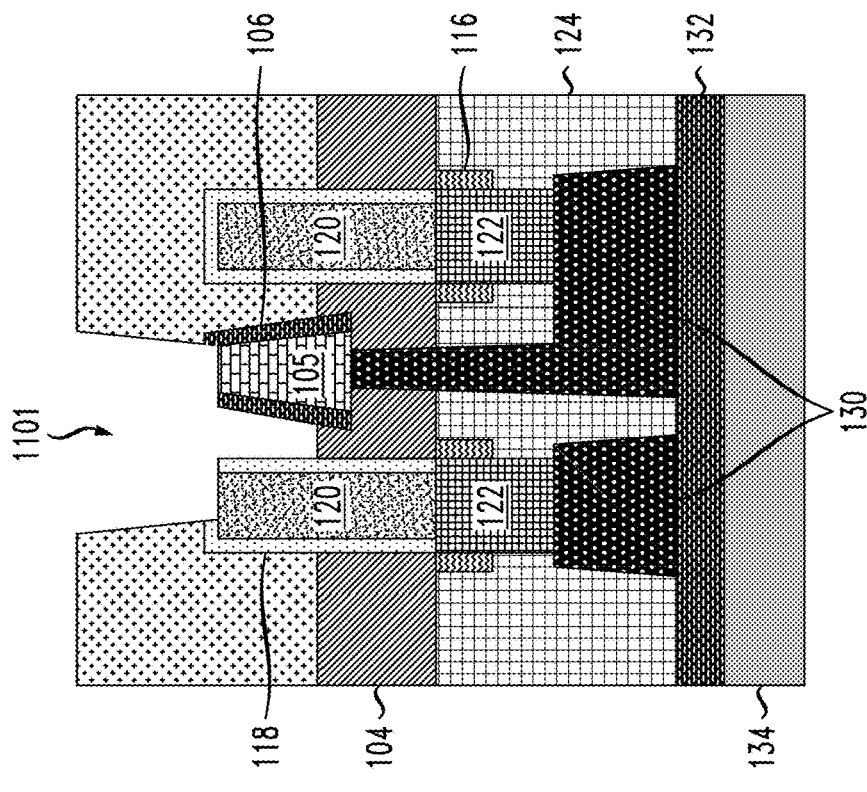
Figure 11A:
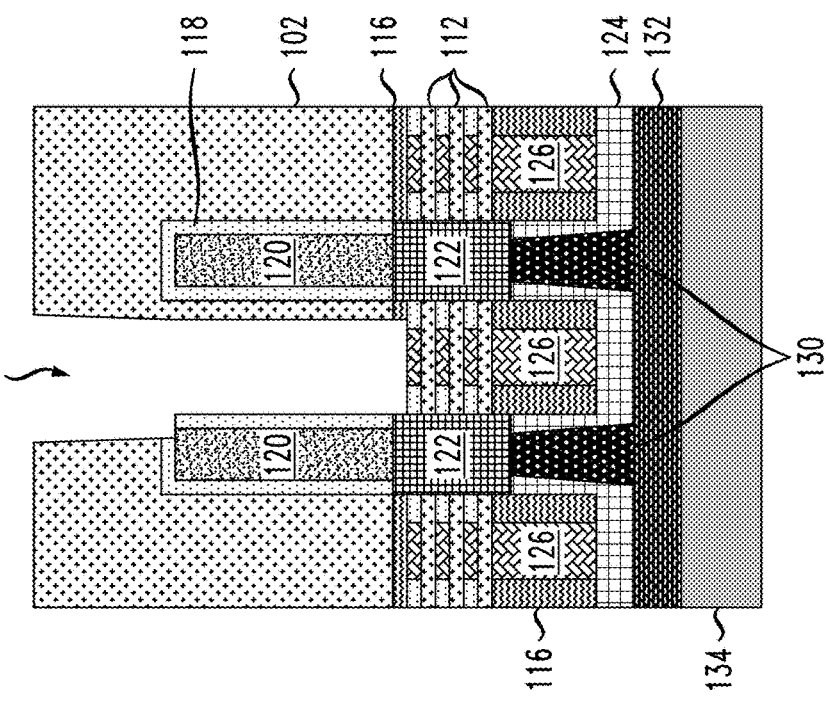
Figure 11E:
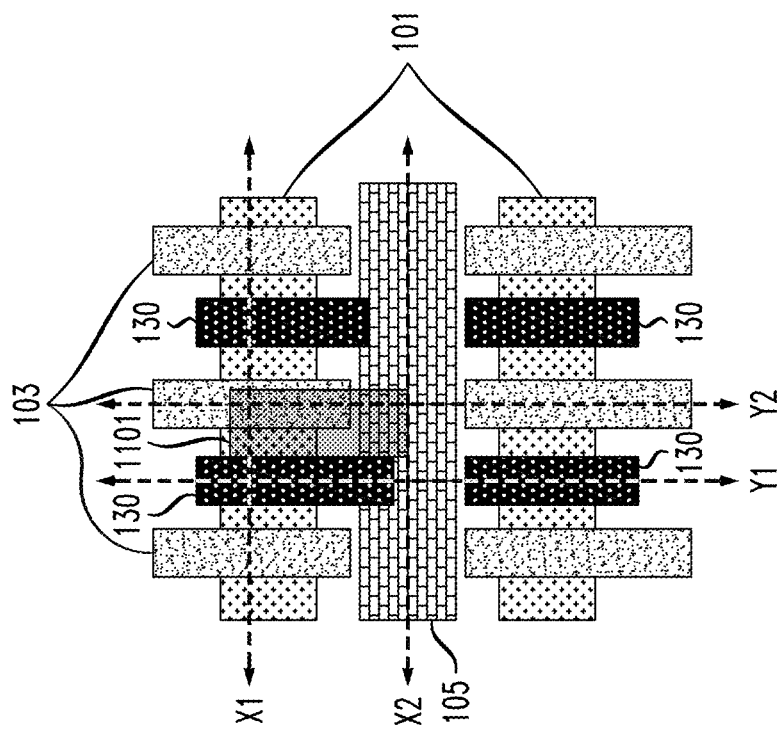

FIGS. 11A-11E show respective cross-sectional views 1100, 1150, 1175 and 1185, and a top-down view 1195, of the FIGS. 10A-10D structure following patterning of trenches for backside gate tie-down features. As shown in FIG. 11A, the dielectric pillars (e.g., dielectric layer 120 formed under the source/drain regions 122) prevent the gate tie-down trench 1101 from shorting to the source/drain regions 122. As shown in FIG. 11E, the backside gate tie-down trench 1101 can have worse alignment compared to front-end-of-line (FEOL) processing. For example, FIG. 11E shows that the backside gate tie-down trench 1101 may be misaligned to the "left" (in direction X-X').

FIGS. 12A-12D show respective cross-sectional views 1200, 1250, 1275 and 1285 of the FIGS. 11A-11E structure following formation of a dielectric spacer 136 and metal layer 138. The dielectric spacer 136 may be formed of any suitable dielectric material, such as SiN, $SiO_2$, SiBCN, SiOCN, SiOC, etc. The dielectric spacer 136 may have a uniform thickness in the range of 5 to 20 nm. The metal layer 138 may be formed of a metal such as copper (Cu), and may include a liner layer (not shown).

Figures 12A, 12B:
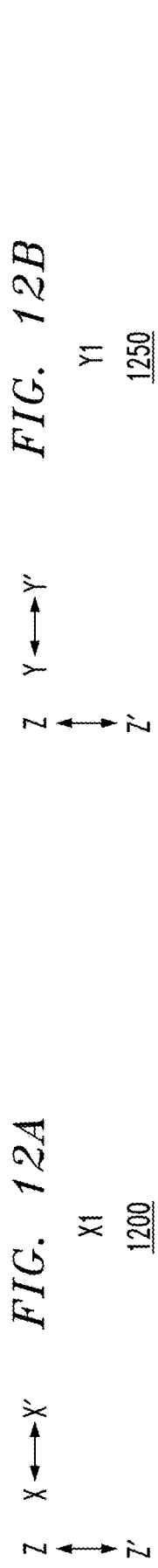
FIGS. 12A-12D depict views of the structure of FIGS. 11A-11E following inner spacer formation and gate tie-down metallization, according to an embodiment of the invention.
Figure 12C:
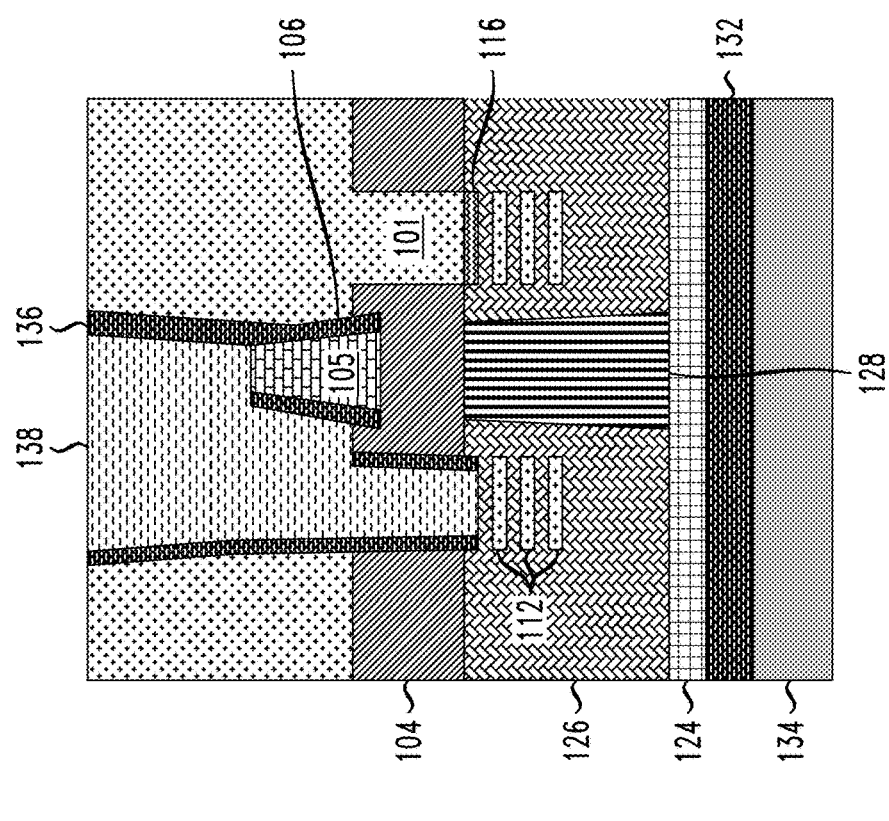
Figure 12D:
Figure 13A:
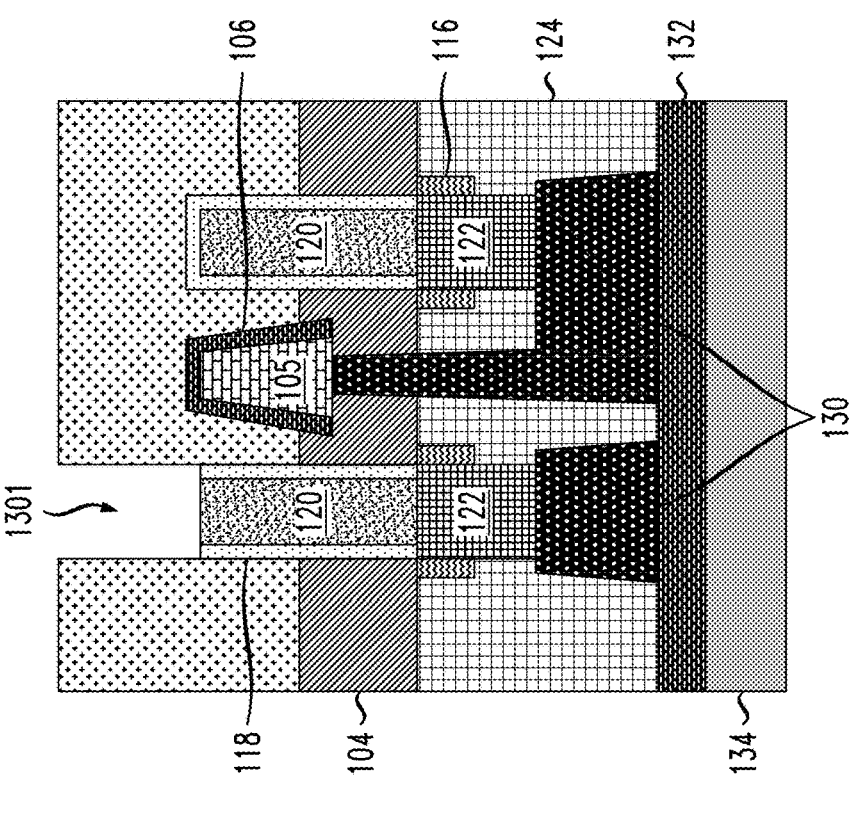
FIGS. 13A-13E depict views of the structure of FIGS. 10A-10D following backside gate contact-over-active region patterning, according to an embodiment of the invention.
Figure 13B:
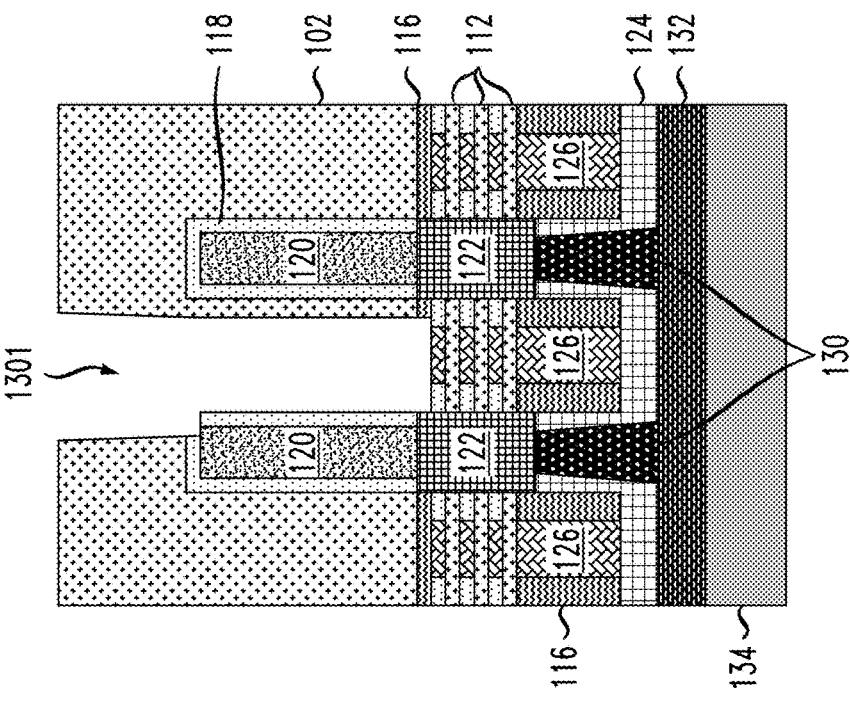
Figure 13D:
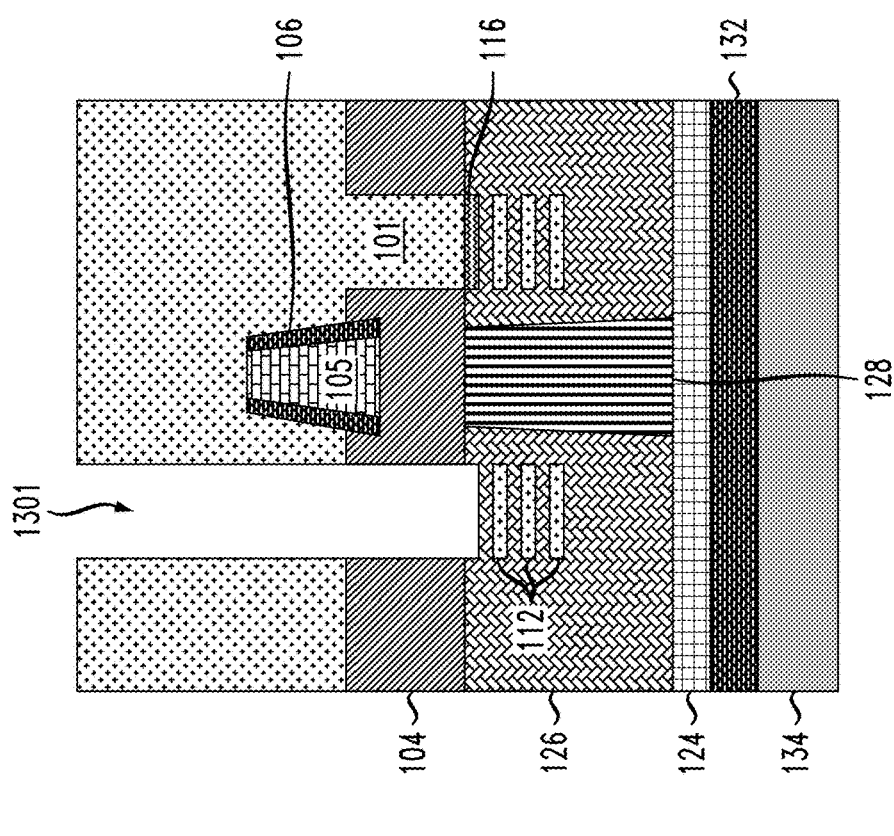
Figure 13C:
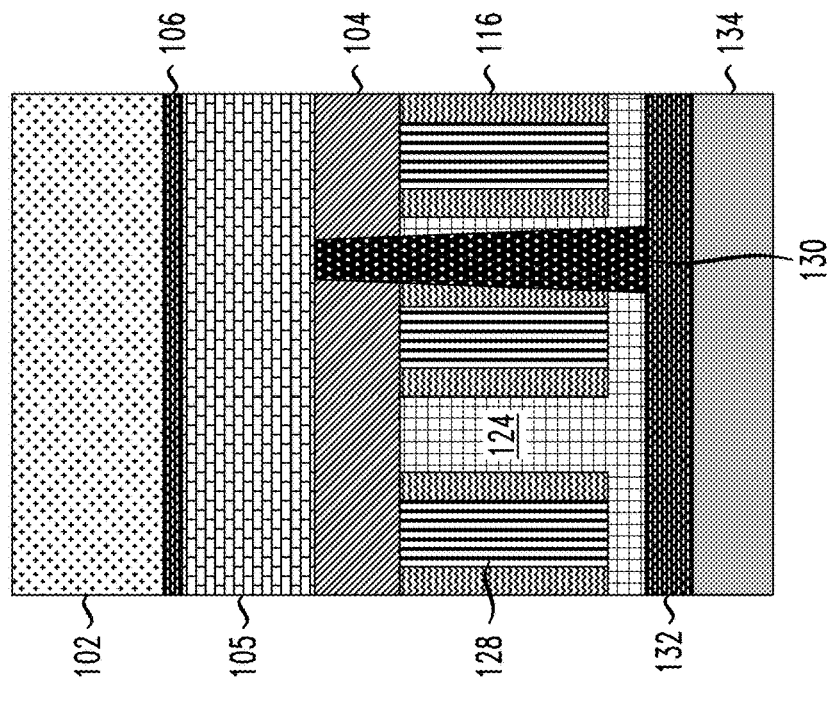
Figure 13E:
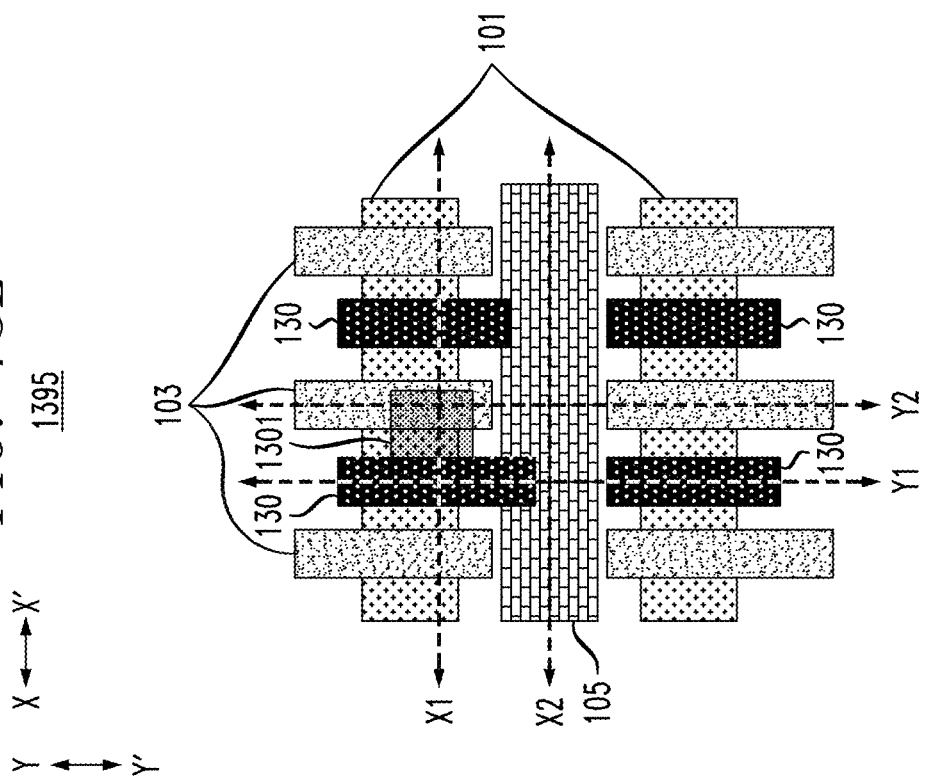
Figure 14D:
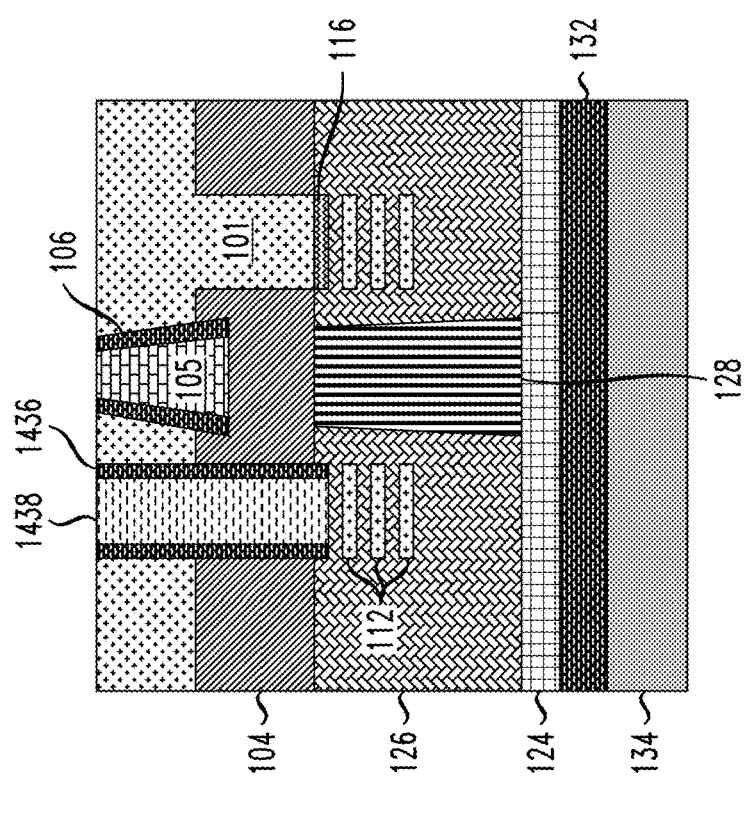
Figure 14C:
Figure 15B:
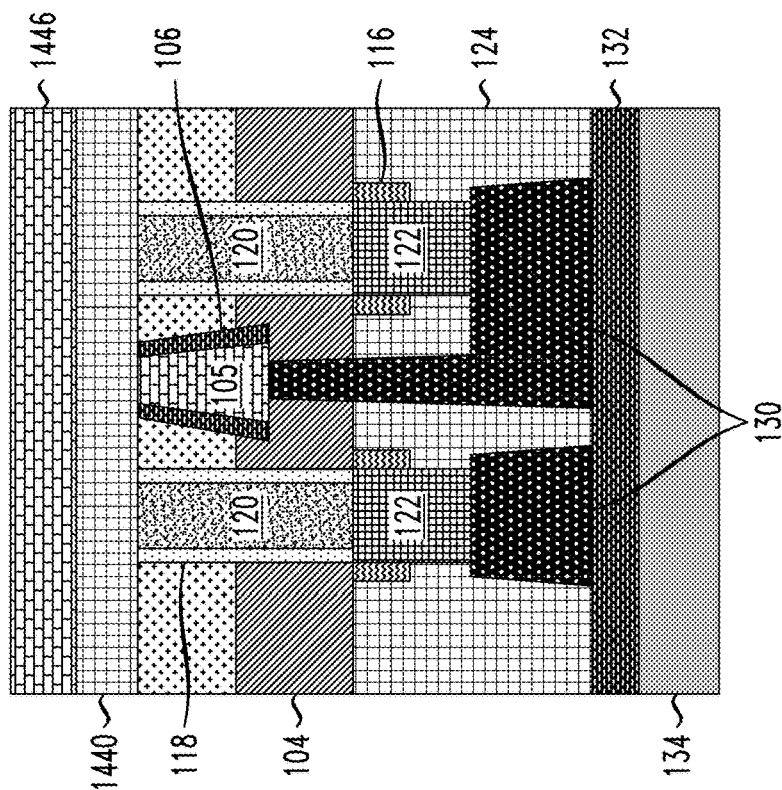
Figure 15A:
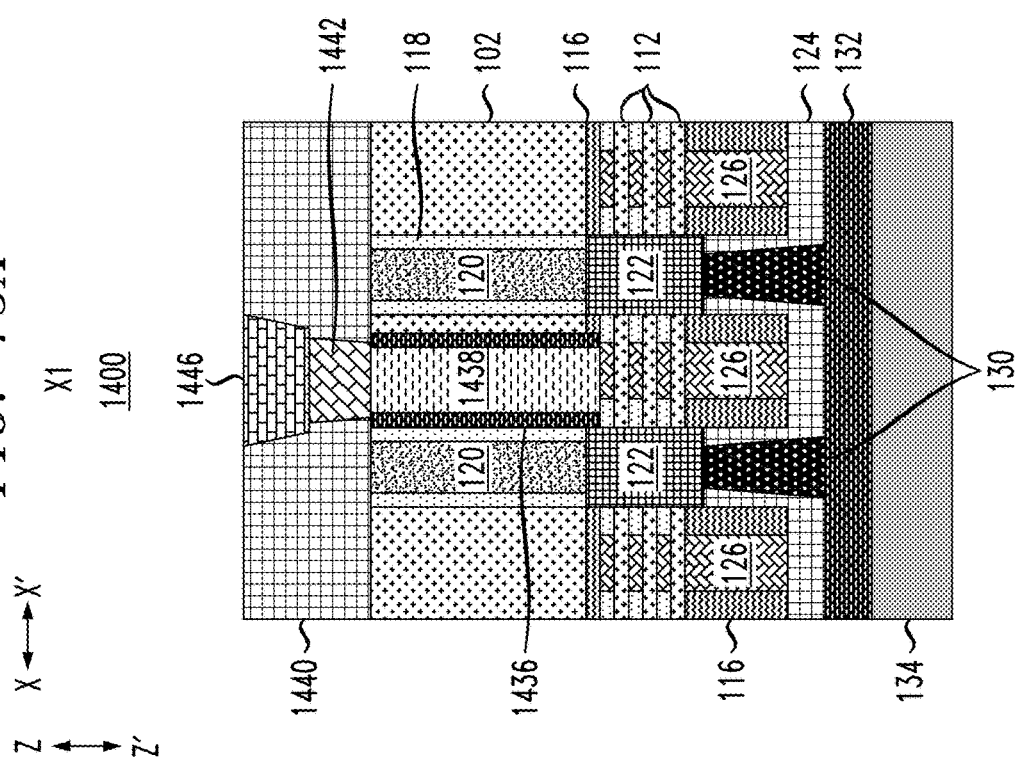
Figures 15C, 15D:
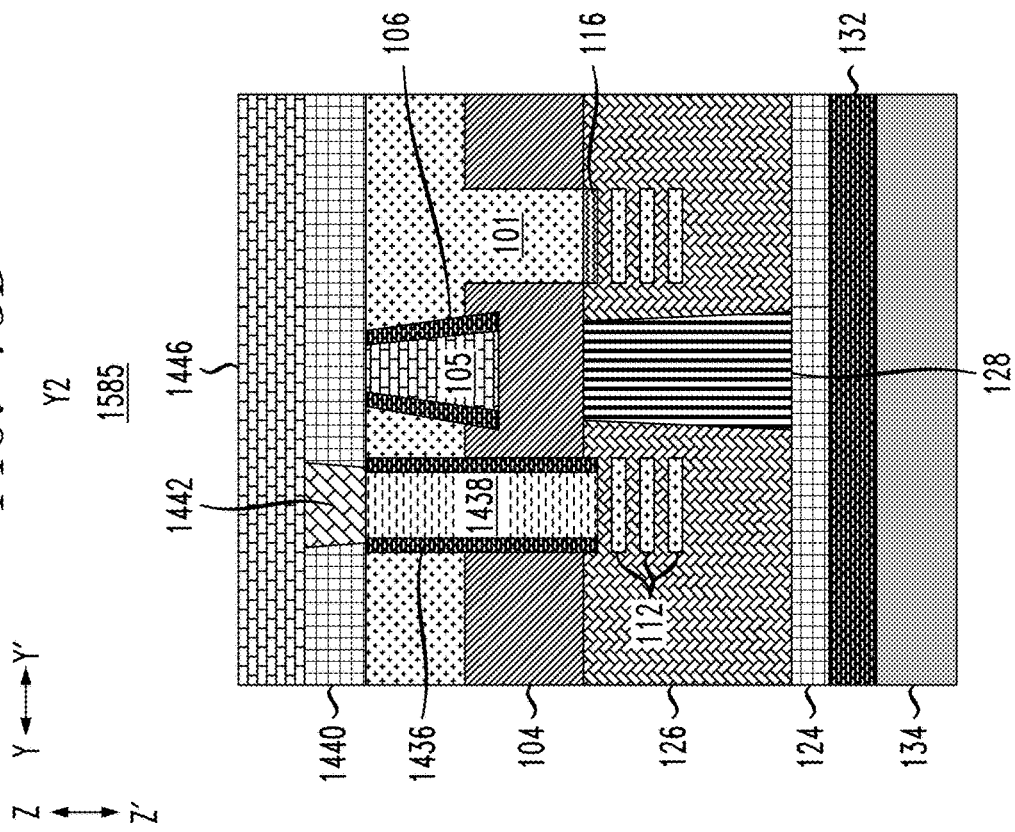

In some embodiments, the process flow of FIGS. 1A-10D may be followed by the processing shown in FIGS. 13A-15F, rather than that of FIGS. 11A-12D, to form backside gate contact-over-active region features. FIGS. 13A-13E show respective cross-sectional views 1300, 1350, 1375 and 1385, and a top-down view 1395, of the FIGS. 10A-10D structure following backside gate contact-over-active region patterning to form backside gate contact-over-active region trench 1301. As shown in FIG. 13A, the dielectric pillars (e.g., dielectric layer 120 formed under the source drain regions 122) prevent the backside gate contact-over-active region trench 1301 from shorting to the source/drain regions 122. As shown in FIG. 13E, the backside gate-contact-over-active region trench 1301 can have worse alignment compared to FEOL processing. For example, FIG. 13E shows that the backside gate contact-over-active region trench 1301 may be misaligned to the "left" (in direction X-X').

FIGS. 14A-14D show respective cross-sectional views 1400, 1450, 1475 and 1485 of the FIGS. 13A-13E structure following formation of a dielectric spacer 1436 and metal layer 1438. The dielectric spacer 1436 and metal layer 1438 may be formed of similar materials, and with similar processing as that described above with respect to dielectric spacer 136 and metal layer 138. The dielectric spacer 1436 may be similar in size to the dielectric spacer 136 (e.g., with a same uniform thickness range). The metal layer 1438 will differ in size as the backside gate-contact-over-active region trench 1301 differs in size relative to the backside gate tie-down trench 1101.

FIGS. 15A-15F show respective cross-sectional views 1500, 1550, 1575, 1580 and 1590, and a top-down view 1595, of the FIGS. 14A-14D structure following formation of an ILD layer 1440, nano through-silicon vias (nTSVs) 1442 and 1444, backside signal line 1446, and backside power distribution network (BSPDN) wiring 1448. The nTSVs 1442 connect to the metal layer 1438, and the nTSVs 1444 connect to the BPR 105. The nTSVs 1442 and 1444, backside signal line 1446 and BSPDN wiring 1448 may be formed of copper (Cu) metallization or other suitable materials.

As noted above, while the process flows of FIGS. 1A-15F are described with respect to semiconductor structures including nanosheet FET devices, embodiments are not limited to semiconductor structures which include nanosheet FET devices. In other embodiments, backside gate tie-down contacts may be formed for other types of structures, such as those shown in FIGS. 16-20.

Figure 16:
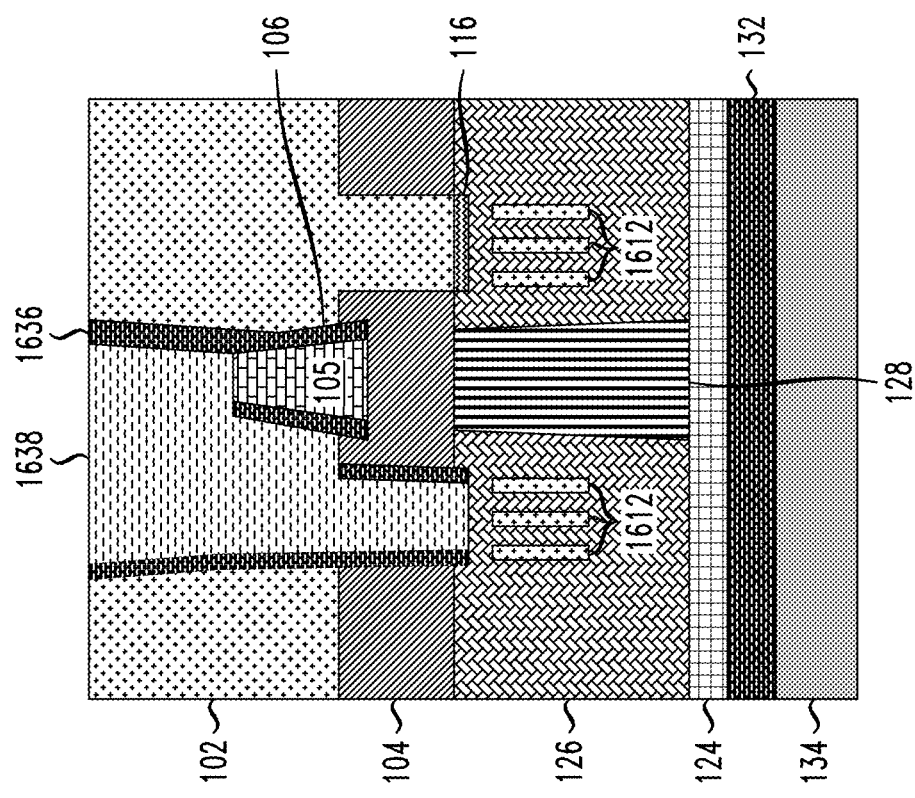
FIG. 16 depicts a semiconductor structure with a buried power rail and a gate tie-down contact to gate metal under fins of gate-all-around fin field-effect transistors, according to an embodiment of the invention.

FIG. 16 shows a cross-sectional view 1600 (which is similar to the Y2 line cross-sectional view 1285 of FIG. 12D), shows a semiconductor structure that comprises GAA FinFET devices. The structure of FIG. 16 similarly includes substrate 102, STI region 104, BPR 105, dielectric spacer 106, spacer layer 116, ILD layer 124, high-k metal gate 126, gate cut 128, BEOL interconnect 132, and carrier wafer 134. Rather than having nanosheet channel layers 112, the FIG. 16 structure includes fins 1612 which are surrounded on all sides by the high-k metal gate 126. The FIG. 16 structure further includes dielectric layer 1636 and metal layer 1638 for a gate tie-down contact that connects the high-k metal gate 126 to the BPR 105.

FIG. 17 shows a cross-sectional view 1700 (which is similar to the Y2 line cross-sectional view 1285 of FIG. 12D), shows a semiconductor structure that comprises a non-GAA FinFET devices. The structure of FIG. 17 similarly includes substrate 102, BOX oxide region 1704, BPR 105, dielectric spacer 106, ILD layer 124, high-k metal gate 126, gate cut 128, BEOL interconnect 132, and carrier wafer 134. Rather than having nanosheet channel layers 112 or fins 1612 surrounded on all sides by high-k metal gate 126, the FIG. 17 structure includes fins 1712 which are surrounded on three sides by the high-k metal gate 126. The FIG. 17 structure further includes dielectric layer 1736 and metal layer 1738 for a gate tie-down contact that connects the high-k metal gate 126 to the BPR 105. The gate tie-down contact in the FIG. 17 structure is to a lateral "side" (e.g., to the left of fins 1712 in direction Y-Y') as it cannot be underneath the fins 1712 (as in the GAA FinFET structure of FIG. 16).

FIG. 18 shows a cross-sectional view 1800 (which is similar to the Y2 line cross-sectional view 1285 of FIG. 12D), shows a semiconductor structure that comprises stacked transistor devices (e.g., stacked VTFET devices). The structure of FIG. 18 similarly includes substrate 102, STI region 104, BPR 105, dielectric spacer 106, spacer layer 116, ILD layer 124, high-k metal gate 126, gate cut 128, BEOL interconnect 132, and carrier wafer 134. The structure of FIG. 18, however, includes channel layers 1812-1 and 1812-2 for lower and upper transistors of the stacked transistor devices. The FIG. 18 structure further includes dielectric layer 1836 and metal layer 1838 for a gate tie-down contact that connects the high-k metal gate 126 surrounding both the channel layers 1812-1 and 1812-2 to the BPR 105. The gate tie-down contact in the FIG. 18 structure is underneath the lower channel layers 1812-1 for the lower transistors of the stacked transistor devices.

Figure 19:
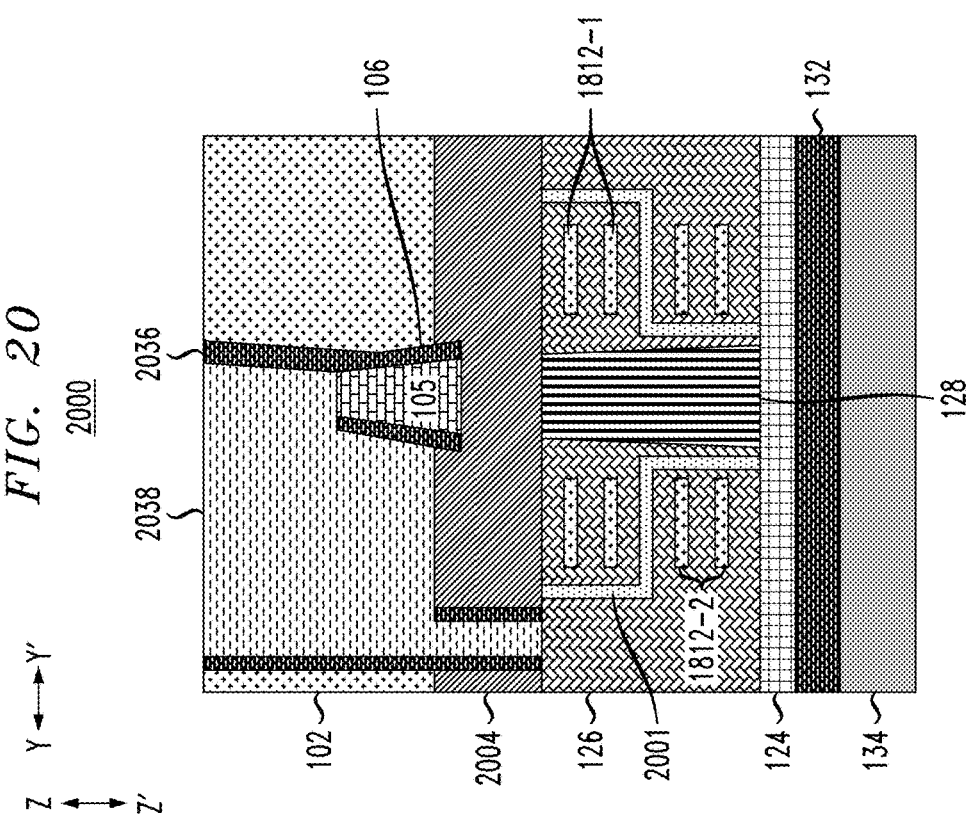
FIG. 19 depicts a semiconductor structure with a buried power rail and a gate tie-down contact to gate metal surrounding lower channels of lower transistors of a stacked transistor structure, where lower and upper transistors of the stacked transistor structure are separated by a dielectric layer, according to an embodiment of the invention.

FIG. 19 shows a cross-sectional view 1900 (which is similar to the Y2 line cross-sectional view 1285 of FIG. 12D), shows a semiconductor structure that comprises stacked transistor devices (e.g., stacked VTFET devices). The structure of FIG. 19 similarly includes substrate 102, STI region 104, BPR 105, dielectric spacer 106, spacer layer 116, ILD layer 124, high-k metal gate 126, gate cut 128, BEOL interconnect 132, and carrier wafer 134. The structure of FIG. 19, however, includes the channel layers 1812-1 and 1812-2 for lower and upper transistors of the stacked transistor devices which are separated by a dielectric spacer 1901. The FIG. 19 structure further includes the dielectric layer 1836 and metal layer 1838 for a gate tie-down contact that connects the high-k metal gate 126 surrounding only the channel layers 1812-1 to the BPR 105. The gate tie-down contact in the FIG. 19 structure is underneath the lower channel layers 1812-1 for the lower transistors of the stacked transistor devices.

Figure 20:
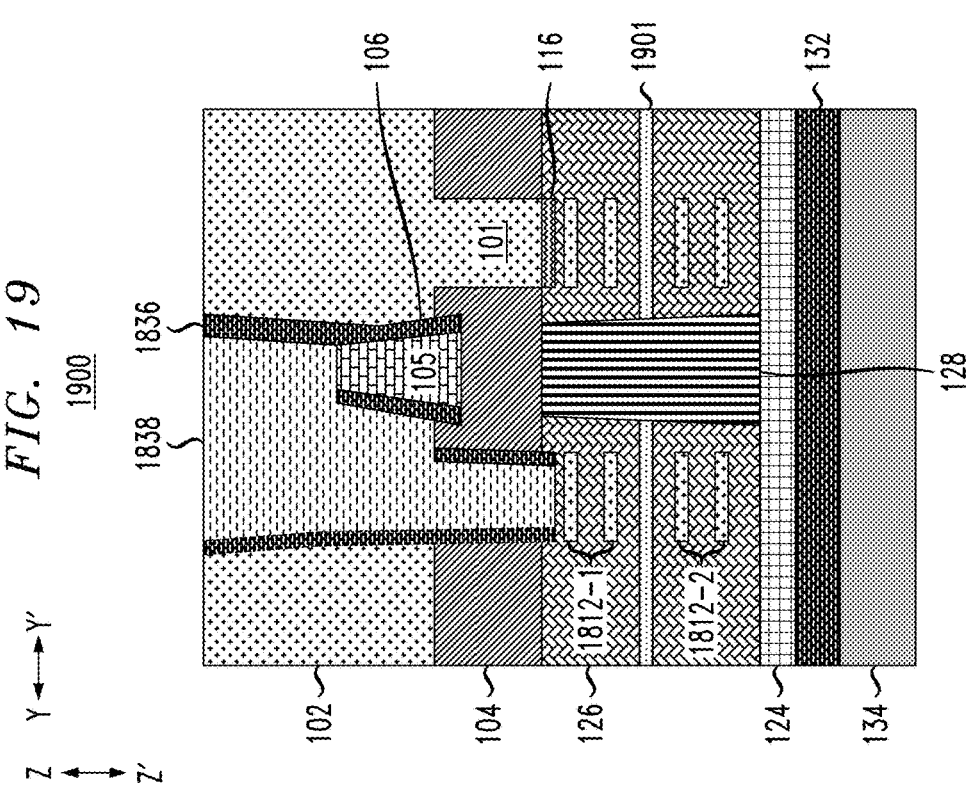
FIG. 20 depicts a semiconductor structure with a buried power rail and a gate tie-down contact to gate metal surrounding upper channels of upper transistors of a stacked transistor structure, where lower and upper transistors of the stacked transistor structure are separated by a dielectric layer, according to an embodiment of the invention.

FIG. 20 shows a cross-sectional view 2000 (which is similar to the Y2 line cross-sectional view 1285 of FIG. 12D), shows a semiconductor structure that comprises stacked transistor devices (e.g., stacked VTFET devices). The structure of FIG. 20 similarly includes substrate 102, BOX oxide layer 2004, BPR 105, dielectric spacer 106, spacer layer 116, ILD layer 124, high-k metal gate 126, gate cut 128, BEOL interconnect 132, and carrier wafer 134. The structure of FIG. 20, however, includes the channel layers 1812-1 and 1812-2 for lower and upper transistors of the stacked transistor devices which are separated by a dielectric spacer 2001. The FIG. 19 structure further includes dielectric layer 2036 and metal layer 2038 for a gate tie-down contact that connects the high-k metal gate 126 surrounding only the channel layers 1812-2 to the BPR 105. The gate tie-down contact in the FIG. 20 structure is to a lateral side of the lower channel layers 1812-1, to connect to the upper transistors of the stacked transistor devices.

The dielectric spacers 1636, 1736, 1836 and 2036 may be formed of similar materials and with similar sizing as that described above with respect to the dielectric spacer 136. The metal layers 1638, 1738, 1838 and 2038 may be formed of similar materials as that described above with respect to the metal layer 138. The sizing of the metal layers 1638, 1738, 1838 and 2038 vary based on the sizing needed for the connections of the respective gate tie-down contacts.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 21:
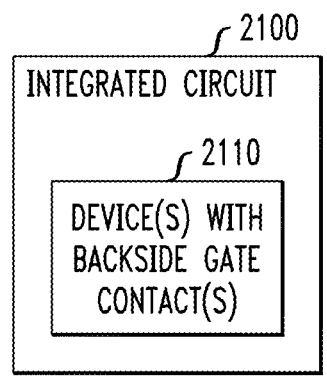
FIG. 21 depicts an integrated circuit comprising one or more devices with backside gate tie-down features, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 21 shows an example integrated circuit 2100 which includes one or more devices with backside gate contacts 2110, which may include gate contacts over active regions and/or gate tie-down contacts.

In some embodiments, a semiconductor structure comprises a substrate having a first side (e.g., a frontside) and a second side (e.g., a backside) opposite the first side, a BPR at least partially disposed in the substrate, a gate for at least one transistor device disposed above the first side of the substrate, and a gate tie-down contact connecting the gate to the BPR from the second side of the substrate.

The semiconductor structure may further comprise one or more source/drain regions of the at least one transistor device disposed above the first side of the substrate and one or more dielectric pillars disposed in the substrate below the one or more source/drain regions, wherein the one or more dielectric pillars separate the gate tie-down contact from the one or more source/drain regions.

The at least one transistor device may comprise a nanosheet FET device, and the semiconductor structure may further comprise two or more nanosheet channel layers for the nanosheet FET device disposed over the first side of the substrate. The gate tie-down contact may connect to a portion of the gate disposed between the two or more nanosheet channel layers and the first side of the substrate.

The at least one transistor device may comprise a FinFET device, and the semiconductor structure may further comprise two or more fin channels disposed over the first side of the substrate. The FinFET device may comprise a GAA FinFET device, and the gate tie-down contact may connect to a portion of the gate disposed between the two or more fin channels and the first side of the substrate. The FinFET device may comprise a non-GAA FinFET device, and the gate tie-down contact may connect to a portion of the gate disposed to a lateral side of the two or more fin channels.

The at least one transistor device may comprise a stacked transistor device comprising two or more channel layers disposed over the first side of the substrate, the two or more channel layers comprising at least a first channel layer for a lower transistor of the stacked transistor device and at least a second channel layer for an upper transistor of the stacked transistor device.

The gate tie-down contact may connect to a portion of the gate that surrounds both the first channel layer and the second channel layer. The portion of the gate surrounding both the first channel layer and the second channel layer may be disposed between the first channel layer and the first side of the substrate.

The first channel layer may be separated from the second channel layer by a dielectric separation layer. The gate tie-down contact may connect to a portion of the gate that surrounds the first channel layer but not the second channel layer. The portion of the gate that surrounds the first channel layer but not the second channel layer may be disposed between the first channel layer and the first side of the substrate. The gate tie-down contact may alternatively connect to a portion of the gate that surrounds the second channel layer but not the first channel layer. The portion of the gate that surrounds the second channel layer but not the first channel layer may be disposed to a lateral side of the first channel layer.

In some embodiments, a semiconductor structure comprises a substrate having a first side (e.g., a frontside) and a second side (e.g., a backside) opposite the first side, one or more source/drain regions disposed over the first side of the substrate, a gate for at least one transistor device disposed above the first side of the substrate, and a gate contact connecting to a portion of the gate from the second side of the substrate, the portion of the gate being adjacent to at least one of the one or more source/drain regions.

The semiconductor structure may further comprise one or more dielectric pillars disposed in the substrate below the one or more source/drain regions, wherein the one or more dielectric pillars separate the gate contact from the one or more source/drain regions.

In some embodiments, a method comprises forming a BPR at least partially in a substrate, the substrate having a first side (e.g., a frontside) and a second side (e.g., a backside) opposite the first side, forming a gate for at least one transistor device over the first side of the substrate, and forming a gate tie-down contact connecting the gate to the BPR from the second side of the substrate.

The method may further comprise forming one or more source/drain regions for the at least one transistor device over the first side of the substrate and forming one or more dielectric pillars in the substrate below the one or more source/drain regions, wherein the one or more dielectric pillars separate the gate tie-down contact from the one or more source/drain regions.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
 a substrate having a first side and a second side opposite the first side;
 a buried power rail at least partially disposed in the substrate;
 a gate for at least one transistor device disposed above the first side of the substrate; and
 a gate tie-down contact connecting the gate to the buried power rail from the second side of the substrate.

2. The semiconductor structure of claim 1, further comprising one or more source/drain regions of the at least one transistor device disposed above the first side of the substrate and one or more dielectric pillars disposed in the substrate below the one or more source/drain regions, wherein the one or more dielectric pillars separate the gate tie-down contact from the one or more source/drain regions.

3. The semiconductor structure of claim 1, wherein the at least one transistor device comprises a nanosheet field-effect transistor device, and further comprising two or more nanosheet channel layers for the nanosheet field-effect transistor device disposed over the first side of the substrate.

4. The semiconductor structure of claim 3, wherein the gate tie-down contact connects to a portion of the gate disposed between the two or more nanosheet channel layers and the first side of the substrate.

5. The semiconductor structure of claim 1, wherein the at least one transistor device comprises a fin field-effect transistor device, and further comprising two or more fin channels disposed over the first side of the substrate.

6. The semiconductor structure of claim 5, wherein the fin field-effect transistor device comprises a gate-all-around fin field-effect transistor device, and wherein the gate tie-down contact connects to a portion of the gate disposed between the two or more fin channels and the first side of the substrate.

7. The semiconductor structure of claim 5, wherein the fin field-effect transistor device comprises a non-gate-all-around fin field-effect transistor device, and wherein the gate tie-down contact connects to a portion of the gate disposed to a lateral side of the two or more fin channels.

8. The semiconductor structure of claim 1, wherein the at least one transistor device comprises a stacked transistor device comprising two or more channel layers disposed over the first side of the substrate, the two or more channel layers comprising at least a first channel layer for a lower transistor of the stacked transistor device and at least a second channel layer for an upper transistor of the stacked transistor device.

9. The semiconductor structure of claim 8, wherein the gate tie-down contact connects to a portion of the gate that surrounds both the first channel layer and the second channel layer.

10. The semiconductor structure of claim 9, wherein the portion of the gate surrounding both the first channel layer and the second channel layer is disposed between the first channel layer and the first side of the substrate.

11. The semiconductor structure of claim 8, wherein the first channel layer is separated from the second channel layer by a dielectric separation layer.

12. The semiconductor structure of claim 11, wherein the gate tie-down contact connects to a portion of the gate that surrounds the first channel layer but not the second channel layer.

13. The semiconductor structure of claim 12, wherein the portion of the gate that surrounds the first channel layer but not the second channel layer is disposed between the first channel layer and the first side of the substrate.

14. The semiconductor structure of claim 11, wherein the gate tie-down contact connects to a portion of the gate that surrounds the second channel layer but not the first channel layer.

15. The semiconductor structure of claim 14, wherein the portion of the gate that surrounds the second channel layer but not the first channel layer is disposed to a lateral side of the first channel layer.

16. An integrated circuit comprising the semiconductor structure of claim 1.

17. A semiconductor structure comprising:
a substrate having a first side and a second side opposite the first side;
one or more source/drain regions disposed over the first side of the substrate;
a gate for at least one transistor device disposed above the first side of the substrate;
a gate contact connecting to a portion of the gate from the second side of the substrate, the portion of the gate being adjacent to at least one of the one or more source/drain regions; and
one or more dielectric pillars disposed in the substrate, at least one of the one or more dielectric pillars being disposed in the substrate below one of the one or more source/drain regions, wherein the at least one dielectric pillar separates the gate contact from said one of the one or more source/drain regions.

18. The semiconductor structure of claim 17, wherein each of the one or more dielectric pillars is disposed in the substrate below a corresponding one of the one or more source/drain regions.

19. A method comprising:
forming a buried power rail at least partially in a substrate, the substrate having a first side and a second side opposite the first side;
forming a gate for at least one transistor device over the first side of the substrate; and
forming a gate tie-down contact connecting the gate to the buried power rail from the second side of the substrate.

20. The method of claim 19, further comprising:
forming one or more source/drain regions for the at least one transistor device over the first side of the substrate;
forming one or more dielectric pillars in the substrate below the one or more source/drain regions;
wherein the one or more dielectric pillars separate the gate tie-down contact from the one or more source/drain regions.

* * * * *